(12) United States Patent
Rebstock

(10) Patent No.: US 12,148,642 B2
(45) Date of Patent: Nov. 19, 2024

(54) HUMIDITY CONTROL IN SEMICONDUCTOR SYSTEMS

(71) Applicant: Brooks CCS GMBH, Radolfzell (DE)

(72) Inventor: Lutz Rebstock, Gaienhofen (DE)

(73) Assignee: Brooks Automation (Germany) GmbH (DE)

( * ) Notice: Subject to any disclaimer, the term of this patent is extended or adjusted under 35 U.S.C. 154(b) by 872 days.

(21) Appl. No.: 15/765,855

(22) PCT Filed: Oct. 5, 2016

(86) PCT No.: PCT/EP2016/073750
§ 371 (c)(1),
(2) Date: Apr. 4, 2018

(87) PCT Pub. No.: WO2017/060278
PCT Pub. Date: Apr. 13, 2017

(65) Prior Publication Data
US 2018/0286726 A1    Oct. 4, 2018

Related U.S. Application Data

(60) Provisional application No. 62/236,990, filed on Oct. 5, 2015.

(51) Int. Cl.
*H01L 21/02* (2006.01)
*F26B 21/08* (2006.01)
*H01L 21/673* (2006.01)

(52) U.S. Cl.
CPC ........ *H01L 21/67393* (2013.01); *F26B 21/08* (2013.01); *H01L 21/02041* (2013.01); *H01L 21/67359* (2013.01); *H01L 21/67389* (2013.01)

(58) Field of Classification Search
CPC ......... H01L 21/67393; H01L 21/67359; H01L 21/67389
See application file for complete search history.

(56) References Cited

U.S. PATENT DOCUMENTS

| | | | |
|---|---|---|---|
| 6,444,587 B1 * | 9/2002 | Lin | ........................ C23F 4/00 257/E21.252 |
| 8,888,434 B2 | 11/2014 | Rebstock | |
| 9,312,152 B2 | 4/2016 | Rebstock | |
| 9,536,763 B2 | 1/2017 | Rebstock | |

(Continued)

FOREIGN PATENT DOCUMENTS

| | | |
|---|---|---|
| TW | 200938794 | 9/2009 |
| TW | 201529187 | 8/2015 |
| WO | 2015087310 | 6/2015 |

OTHER PUBLICATIONS

International Search Report, International Application No. PCT/EP2016/073570, dated Jan. 19, 2017.

*Primary Examiner* — Sharidan Carrillo
(74) *Attorney, Agent, or Firm* — Perman & Green, LLP

(57) ABSTRACT

Method for forming a clean environment for semiconductor substrates with low humidity level including the steps of measuring a humidity level in the environment using a humidity sensor to keep the environment within a predetermined interval around a humidity set point or at a humidity set point and providing a gas to the environment, until the humidity level reduces to a value within the predetermined interval around the set point or to the set point.

10 Claims, 25 Drawing Sheets

(56) References Cited

U.S. PATENT DOCUMENTS

| | | |
|---|---|---|
| 2010/0282272 A1 | 11/2010 | Godot et al. |
| 2011/0114129 A1 | 5/2011 | Kishkovich et al. |
| 2012/0083918 A1* | 4/2012 | Yamazaki ......... H01L 21/67389 |
| | | 700/112 |
| 2012/0325271 A1 | 12/2012 | Rebstock |
| 2014/0076773 A1* | 3/2014 | Huang ............. H01L 21/67393 |
| | | 206/710 |
| 2014/0305540 A1* | 10/2014 | Oyama ............ H01L 21/67389 |
| | | 141/4 |
| 2015/0024671 A1* | 1/2015 | Taniyama ................. F24F 9/00 |
| | | 454/193 |
| 2015/0045961 A1 | 2/2015 | Koshti et al. |
| 2015/0170939 A1 | 6/2015 | Rebstock |
| 2018/0229276 A1* | 8/2018 | Tsubaki ............ H01L 21/67389 |
| 2018/0229277 A1* | 8/2018 | Onishi .................... B08B 5/023 |
| 2018/0247846 A1* | 8/2018 | Murata ............ H01L 21/67389 |
| 2018/0286726 A1* | 10/2018 | Rebstock .......... H01L 21/67389 |
| 2020/0227295 A1* | 7/2020 | Murata ............. H01L 21/67393 |

\* cited by examiner

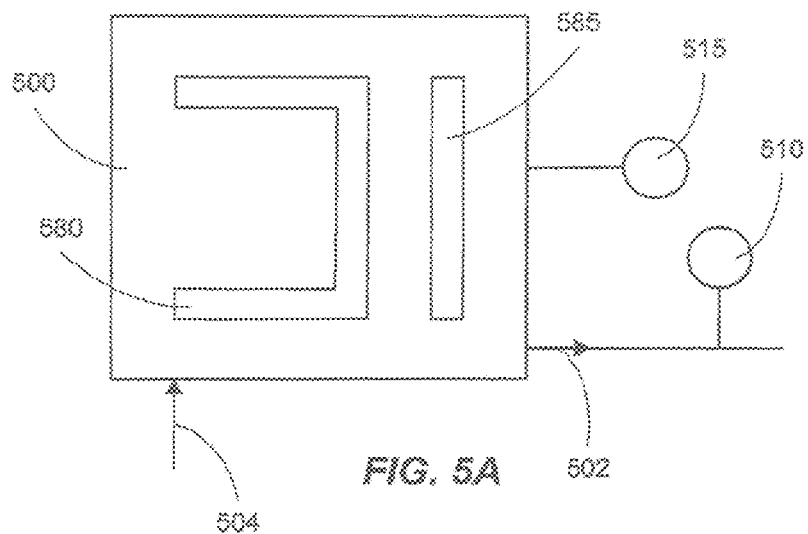
FIG. 5A
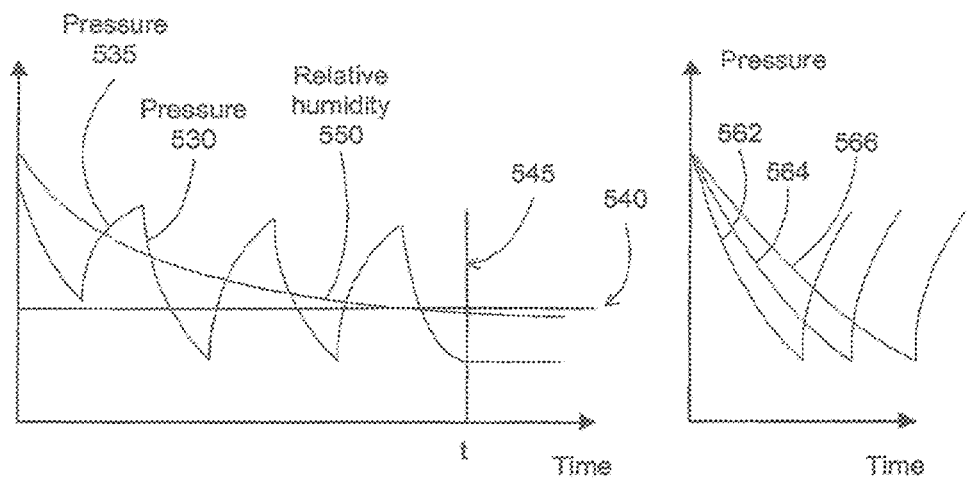
FIG. 5B
FIG. 5C

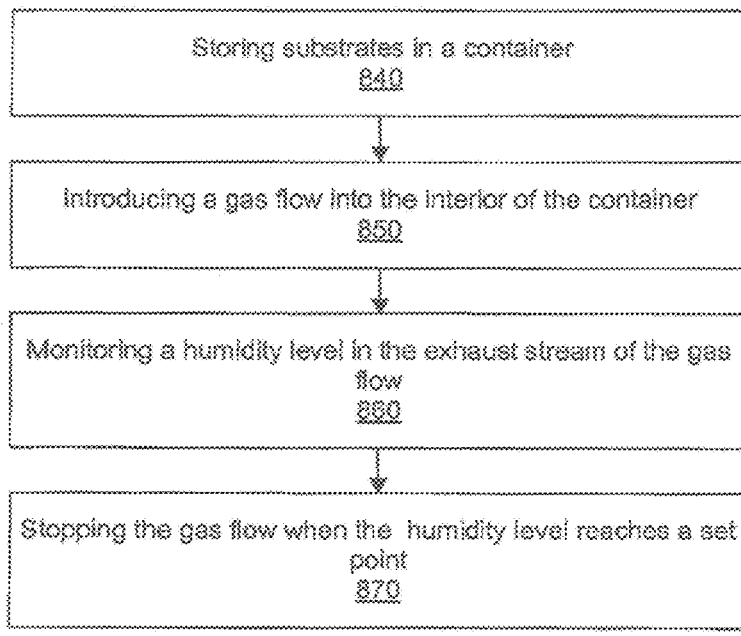

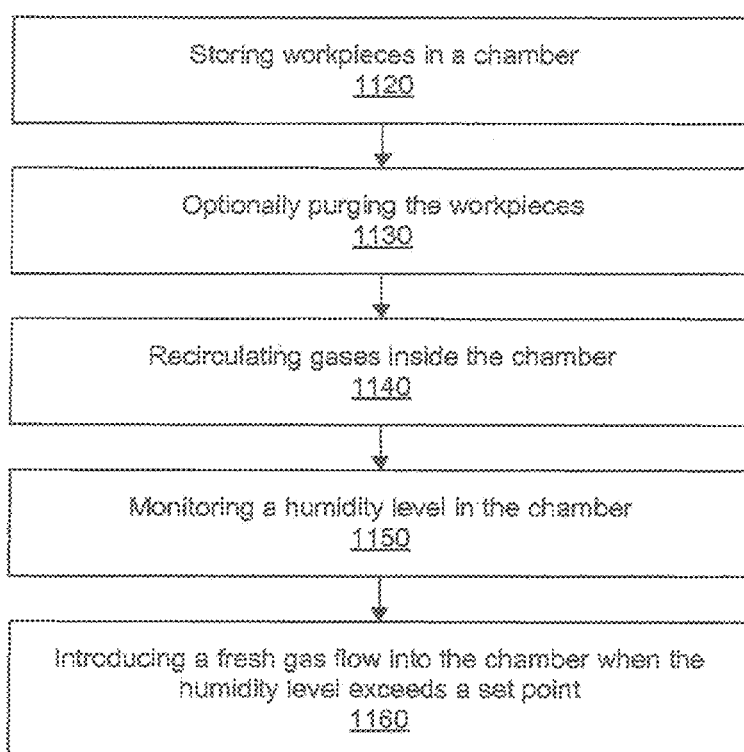

HUMIDITY CONTROL IN SEMICONDUCTOR SYSTEMS

CROSS-REFERENCE TO RELATED APPLICATIONS

This application is the National Stage of International Application No. PCT/EP2016/073750, having an International Filing Date of 5 Oct. 2016, which designated the United States of America, and which International Application was published under PCT Article 21(2) as WO Publication No. 2017/060278 A1, and which claims priority from, and the benefit of, U.S. provisional Application No. 62/236,990, filed on 5 Oct. 2015, the disclosures of which are incorporated herein by reference in their entireties.

BACKGROUND

Production of semiconductor devices requires cleanliness of substrates, such as wafers, reticles, and glass substrates, as well as containers used for storing and transferring these substrates and stockers used for storing these substrates. Presence of particulates and other contaminant can negatively impact production yields. The transport of the semiconductor substrates is typically carried out in containers, such as cassettes, carriers, trays, Front Opening Unified Pod (FOUP), Front-Opening Shipping Box (FOSB), Standard Mechanical Interface (SMIF), pods, and boxes. For example, a FOUP typically includes one or more comb-like guiding structures positioned inside a shell for supporting substrates. The FOUP also includes a door that can be removed from the shell and allow a substrate handling robot to access the substrates from the shell. The semiconductor substrates are typically stored in stockers, which include a storage chamber for holding a large number of substrates.

Containers, such as FOUPs, used for storing and transferring semiconductor substrates need to be periodically cleaned in order to prevent contamination of substrates and to maintain the standard of cleanliness needed for the substrates. In addition, a purge gas can be provided to the inside of the containers to further prevent outgasing and potentially contaminating the substrates.

Stockers can be used for storing semiconductor substrates, such as storing bare substrates, e.g., substrates without containers, or substrates disposed in containers such as FOUPs. In addition to maintaining a cleanliness inside the stockers, a purge gas can be provided within the stockers to prevent contamination.

There is a need to improve the cleanliness of the containers and stockers.

BRIEF DESCRIPTION OF THE DRAWINGS

The foregoing aspects and other features of the disclosed embodiment are explained in the following description, taken in connection with the accompanying drawings, wherein:

FIGS. 5A-5C illustrate a configuration for a vacuum decontamination chamber according to some aspects of the disclosed embodiment;

FIGS. 8A-8C illustrate flow charts for conditioning a container according to some aspects of the disclosed embodiment;

FIGS. 11A-11B illustrate flow charts for conditioning a stocker according to some aspects of the disclosed embodiment;

DETAILED DESCRIPTION

Figure 1A:
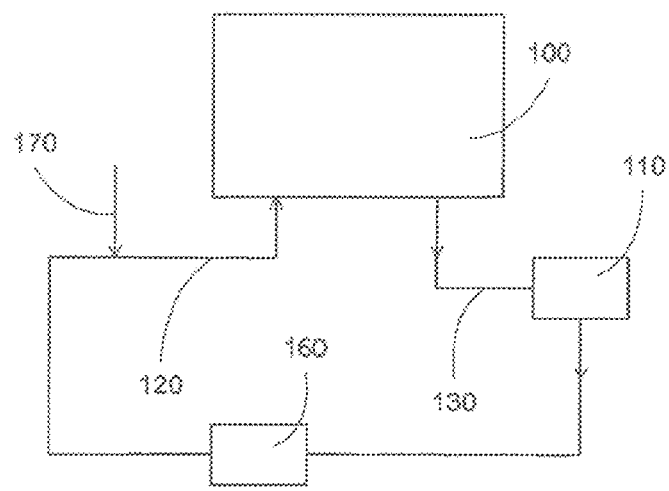
FIGS. 1A-1B illustrate a humidity control system according to some aspects of the disclosed embodiment.

The present embodiment discloses methods and systems for forming a clean environment for semiconductor substrates, which include forming an environment with low humidity level. A humidity sensor can be used to detect a humidity level in the environment to keep the environment within a predetermined interval around a predetermined humidity set point or at a predetermined humidity set point. The gas can be provided to the environment until the humidity level reduces to a value within the predetermined interval around the set point or to the set point.

According to a preferred aspect of the disclosed embodiment, the gas in the environment can be recirculated, for example, to reduce consumption of gases.

Advantageously, a humidity reducing assembly can be coupled to the recirculated gas stream to reduce the humidity level in the return gas stream.

In addition, fresh dry gas can preferably be added when the humidity level exceeds a predetermined threshold. The fresh dry gas can be added, for example, directly to the environment or the recirculated gas stream. The predetermined threshold can for example be one of the borders of the predetermined interval around the set point.

The humidity level can advantageously be measured from the gas in the environment, or from the gas in the exhaust of the provided gas, or in the recirculated gas stream.

The humidity level can preferably also be measured from a rate of pressure reduction, e.g., the gas inside the environment can be evacuated, with high humidity gas evacuated more slowly than low humidity gas.

In some aspects of the disclosed embodiment, after being cleaned, a container can be subjected to a chamber for removing contaminants. The chamber can be a vacuum chamber for outgasing contaminants from the container. The chamber can be a purge chamber for removing contaminants from the container The evacuation of gases in the vacuum chamber, or the purging of gases in the purge chamber can be coupled to a humidity level sensor, so that the process can be stopped or continued to a different processing mode when the humidity level in the container reaches a set point, such as below 10% or below 5% relative humidity, or between 5 and 10% humidity. In some aspects of the disclosed embodiment, an inside of a container can be purged with a low humidity gas, such as dry air or dry nitrogen gas, until the humidity level in the container reaches a set point, such as below 10% or below 5% relative humidity, or between 5 and 10% humidity. The purge gas then can be recirculated, with fresh dry gas added based on a humidity feedback, for example, to maintain a constant humidity level.

In some aspects of the disclosed embodiment, a stocker can have a recirculating gas to maintain a cleanliness level. The stocker can have a feedback loop to maintain a constant humidity level. For example, fresh dry gas can be added when the humidity in the stocker exceeds a set point. The recirculating gas can be provided inside the stocker and outside storage modules in which the semiconductor substrates are stored. A purge gas can be provided to the storage modules to maintain a low particulate environment. The purge gas to the storage modules can be recirculated, with fresh dry gas added based on a humidity feedback.

Figure 1B:
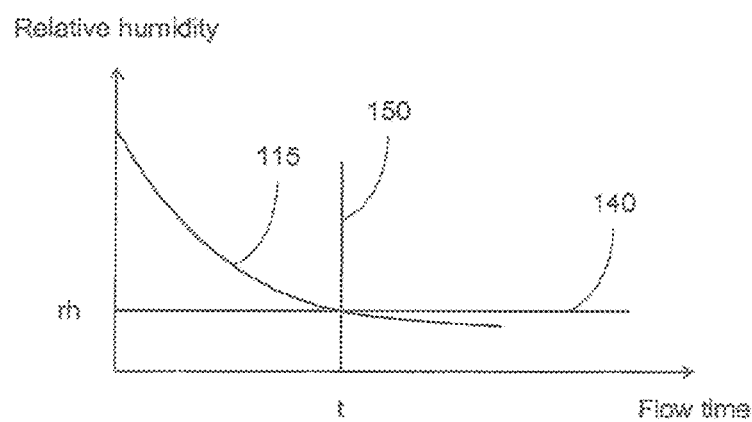

FIGS. 1A-1B illustrate a humidity control system according to some aspects of the disclosed embodiment. An environment 100 is formed e.g. within a container for storing semiconductor substrates for transport or within a chamber for storing semiconductor substrates or for storing containers. To use an alternative wording, such a container, as well as chambers for holding or processing such a container may sometimes be directly be referred to as environment in this specification.

The environment 100 can be purged with an inactive gas 120, such as air or nitrogen. A humidity sensor 110 can be coupled to the exhaust stream 130 of the inactive gas, for measuring the humidity level in the exhaust stream. Alternatively, the humidity sensor can be coupled to the environment 100 to measure the humidity in the environment. The humidity sensor can include a hygrometer, which can measure humidity using a capacitive hygrometer, a resistive hygrometer, a thermal hygrometer, or a gravimetric hygrometer. The humidity sensor can measure humidity indirectly, such as using a pressure sensor to measure the rate of pressure reduction for extracting humidity level.

In some aspects of the disclosed embodiment, the exhaust stream 130 can be recirculated, e.g., the gas flow from the exhaust stream 130 can be provided to the input stream 120. A gas conditioning system 160, which can include a gas purifier and a humidity reduction, can be used to conditioning the purge gas flow. For example, the input gas flow 120 can include a dry gas, e.g., having a humidity level less than 10%, less than 5%, or between 5 and 10% humidity. The exhaust stream 130 can have higher humidity, depending on the humidity in the environment 100, The gas conditioning system 160 can condition the exhaust flow 130, for example, by removing particulates with filters and by removing moisture with desiccant in the exhaust stream.

In some aspects of the disclosed embodiment, the recirculated loop, e.g., the coupling of the exhaust stream 130 to the input stream 120 (through the gas conditioning system 160) can be supplied with a fresh dry gas input 170. The fresh dry gas input 170 can be used to further reducing the humidity in the input stream 120, for example, by adding fresh dry gas when the humidity level in the recirculated gas exceeds a certain set point, for example, as measured by the humidity sensor 110.

The purging of the environment 100, e.g., with the inactive gas 120, can reduce the humidity in the environment. The humidity 115 in the environment can be reduced to a set point 140 at a time t 150. In some aspects of the disclosed embodiment, the purge gas 120 can be stopped, or the another processing condition can occur when the humidity reaches the humidity set point 140.

In some aspects, the present embodiment discloses using humidity as a condition for maintaining cleanliness in a storage environment, such as in a container that contains semiconductor substrates, or in a stocker that stores containers or semiconductor substrates.

Figure 2A:
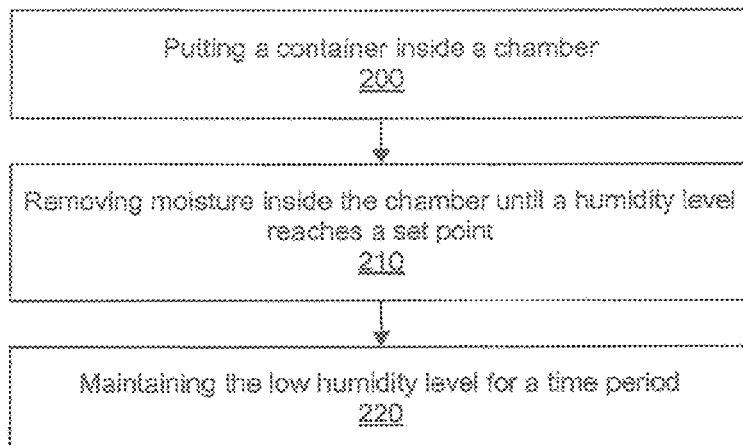
FIGS. 2A-2C illustrate flow charts for humidity controlled environments according to some aspects of the disclosed embodiment.
Figure 2B:
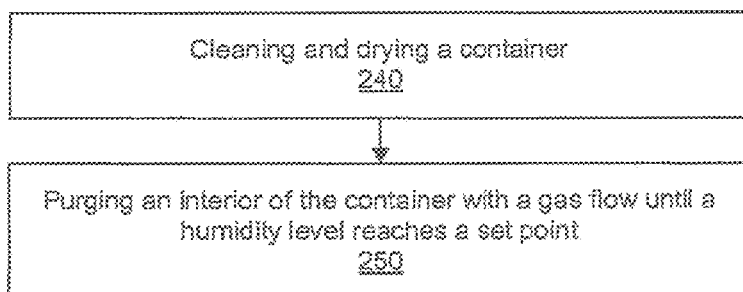
Figure 2C:
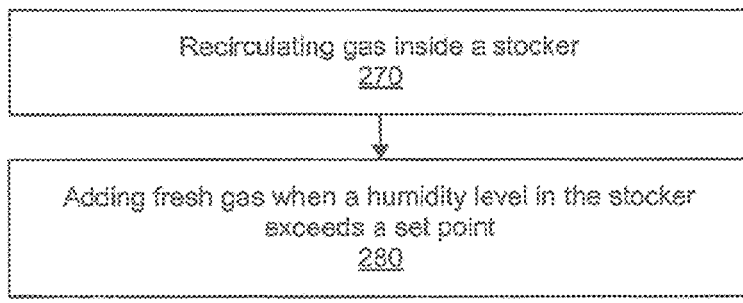

FIGS. 2A-2C illustrate flow charts for humidity controlled environments according to some aspects of the disclosed embodiment. In FIG. 2A, the interior of an environment can be processed until the humidity in the environment reduces to a set point. The environment can be formed or provided within a chamber for processing a container, such as for removing contaminants on the container. For example, a container can provided into a chamber. The container can be contaminated with contaminants, such as moisture or particulates adhering to a surface of the container, or molecules embedded inside the container walls. The container can be first cleaned to remove surface contaminants, and optionally dried. The chamber can be a vacuum chamber for outgasing contaminants from the container, or for removing adhered moisture on the container surface. The vacuum level in the chamber can be processed until the humidity level reduces to a set point, such as below 10%, below 5% relative humidity, or between 5 and 10% humidity. The vacuum chamber can be maintained at the low humidity set point for a time period.

Operation 200 providing, especially placing or putting, a container inside a chamber. The container can be cleaned, and optionally dried or partially dried. The container can be placed in an open configuration, such as the lid of the container is opened or placed at a position to expose the interior of the container.

Operation 210 removes moisture until humidity reaches a set point. For example, the chamber can be evacuated using a pumping mechanism. A pump/purge process can be used for removing moisture, e.g., the chamber is evacuated, followed by a supply of purge gas. The evacuation and purging process can be repeated until the humidity level is reduced to a value within the predetermined interval around the set point or to the set point. The humidity level can be measured from the exhaust gas evacuated from the chamber. The humidity level can be measured from the residue gas inside the chamber. The humidity level can be measured indirectly, for example, from the rate of pumping of the gas inside the chamber.

Operation 220 optionally maintaining the low humidity condition in the chamber for a predetermined period of time. The low humidity level can assist in removing the contaminants, such as moisture at the surface of the container or for outgasing the contaminants in the container. Further, the low humidity level of below 10 or 5% can provide a long term cleanliness for the container.

In FIG. 2B, an interior of an environment can be purged with a low humidity gas, such as dry air or dry nitrogen gas, until the humidity in the environment reduces to a set point. The environment can be within a container for containing semiconductor substrates. For example, the interior of a container needs to be cleaned for not contaminating the semiconductor substrates that are stored therein, for example, from moisture or particulates adhering to a surface of the container, or molecules embedded inside the container walls. The container can be filled with a low humidity gas to assist in preventing contaminates from reaching the substrates in the container. The humidity level inside the container can be below a set point, such as below 10 or 5% relative humidity, to provide a long term prevention of contamination.

Operation 240 optionally cleaning and optionally drying a container. Operation 250 purges an interior of the container with a gas flow until a humidity level reaches a set point. The container can be previously cleaned and dried. The container can be a container in service, e.g., not being cleaned immediately before the purging operation. The humidity level can be measured or calculated from a signal representative of a humidity level in the container. For example, the humidity level can be measured from the exhaust gas evacuated from the container, using a hygrometer. The humidity level can be measured from the rate of the pressure drop in the container. For example, the purge gas can be stopped, and the gas inside the container is evacuated, in which time, the pressure reduction rate can be measured for an indication of humidity level. The purge gas can resume, and the process can be repeated until the humidity level is satisfactory.

The purge gas can be fresh dry gas, or the purge gas can be recirculated gas. If the purge gas is a recirculated gas, then a humidity control, e.g., a humidity reduction system (such as a desiccant filter), can be used to ensure that the return gas has a low humidity. In addition, fresh dry gas can be added to maintain a low humidity level. The fresh gas can be added based on a humidity feedback, for example, from a humidity sensor installed in the return gas.

In FIG. 2C, an interior of a first environment can be purged with a low humidity gas, such as dry air or dry nitrogen gas, until the humidity in the environment reduces to a value within the predetermined interval around the set point or to the set point. A second environment can be formed in the first environment, together with another purge gas for the second environment. The first environment can be a stocker for storing containers, and the second environment can be a container for containing semiconductor substrates. The semiconductor substrates stored in the containers can be kept at a clean environment through a purge gas through the containers, and the containers can be kept at a clean environment through a purge gas through the stocker. The humidity level inside the stocker and/or the container can be below a set point, such as below 10, 5% relative humidity, or between 5 and 10% humidity, to provide a long term prevention of contamination. The purge gas to the containers and/or to the stocker can be recirculated, with fresh dry gas added based on a humidity feedback.

Operation 270 recirculates a gas inside a stocker. The gas recirculation can reduce the gas consumption, which can reduce operating cost for the stocker. The recirculating gas can be subjected to a moisture removal assembly, such as a desiccant system, to maintain a low humidity environment in the stocker.

Operation 280 adds fresh gas to the recirculating gas, for example, based on a level of humidity measured in the stocker or in the recirculating gas, to maintain a desired humidity level in the stocker.

A purge gas can be supplied to containers, which are stored in the stocker. The purge gas can maintain the semiconductor substrates in the containers at a desired cleanliness level. The purge gas can be merged with the recirculating gas in the stocker after exiting the containers. The purge gas can recirculate, e.g., the exhaust stream exiting the container can be filtered, particulate filtered and moisture filtered, before returning to the containers. Fresh gas can be added to the recirculating gas through the containers, for example, based on a level of humidity measured in the containers or in the recirculating gas, to maintain a desired humidity level in the containers.

In some aspects, the presently disclosed embodiment recognizes that relative humidity, above a certain set point such as above 10% or above 5%, can contaminate semiconductor substrates. For example, data show that if humidity level is still high after a purge, outgasing can be high and humidity level can overshoot, e.g., due to liquid coming out. In contrast, if a container is purged to a humidity level of 5-10% or less, then humidity level will gradually reaches the room humidity after the purge is stopped.

Figure 3A:
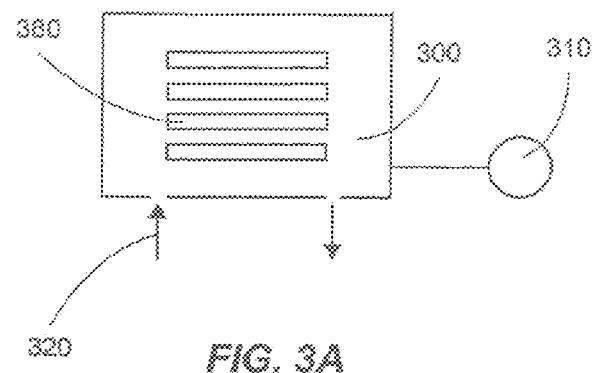
FIGS. 3A-3B illustrate configurations for a purging system with different humidity levels according to some aspects of the disclosed embodiment.
Figure 3B:
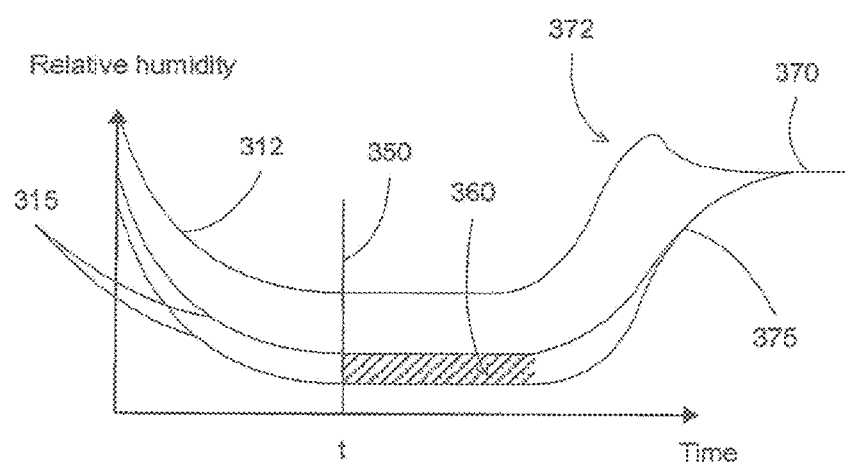

FIGS. 3A-3B illustrate configurations for a purging system with different humidity levels according to some aspects of the disclosed embodiment. Semiconductor substrates 380 can be stored in a container 300. A purge gas 320 can be supplied to the container. Humidity level in the container can be measured by a humidity sensor 310, such as a hygrometer. The purge gas 320 can have a low humidity, such as a dry nitrogen or dry air, e.g., humidity less than 10 or 5%. The humidity levels 312 and 315 in the container can be gradually reduced with time, for example, due to the purge gas driving out the moisture. At a time t 350, the purge gas can stop.

If the humidity levels 315 is below a range 360, the humidity can gradually increase 375 to the ambient humidity 370. If the humidity level 312 is still high in the container when the purging is stopped at time t 350, the humidity level can overshoot 372 before returning to the ambient value 370.

The overshoot can be caused by the residue moisture in the container, and can contribute to the contamination of the substrates in the container.

Thus, in some aspects, the present embodiment discloses forming a low humidity environment, e.g., less than 10%, less than 5% humidity, in some cases, less than 2% or 1% humidity, or between 5 and 10% humidity, and to reduce the contamination of the substrates stored in the environment.

In some aspects, the present embodiment discloses a decontamination chamber for decontaminating a container, such as the body and the lid of a container. A vacuum chamber can be used for the decontamination, for example, by evacuating any contaminants adhering to the surface of the container, or by outgasing contaminants horn the container materials. The decontamination can have a humidity level below a set point, such as below 10 or 5% relative humidity level, or between 5 and 10% humidity. The decontamination can have the low humidity level maintained in a time period, such as longer than 1 minutes, longer than 2, 5 or 10 minutes. The low humidity level of the decontamination chamber can improve the cleanliness of the objects to be decontaminated, such as maintaining a long term cleanliness after removed from the decontamination chamber.

Figure 4A:
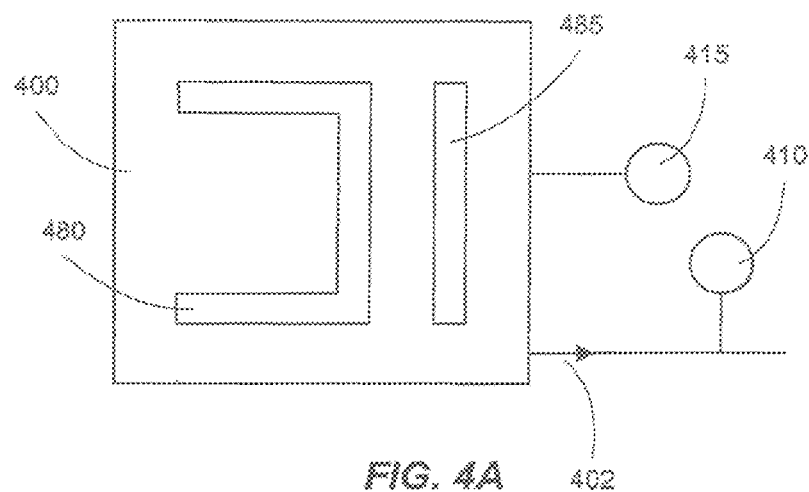
FIGS. 4A-4B illustrate a configuration for a vacuum decontamination chamber according to some aspects of the disclosed embodiment.
Figure 4B:
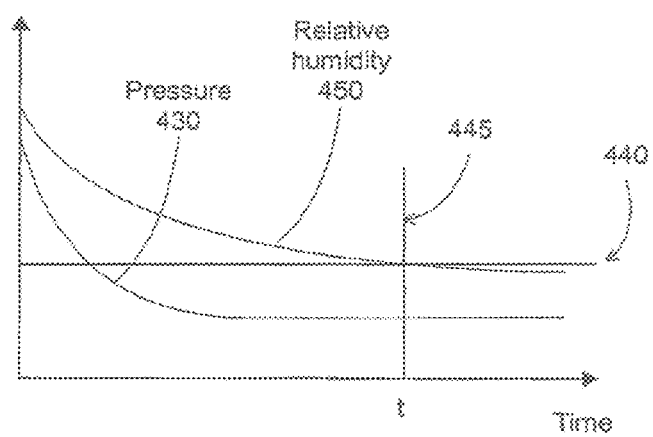

FIGS. 4A-4B illustrate a configuration for a vacuum decontamination chamber according to some aspects of the disclosed embodiment. A chamber 400 can include a pumping mechanism for evacuating the gas inside the chamber. The pumping mechanism can form an exhaust flow 402 exiting the chamber 400. A humidity sensor 410 can be coupled to the exhaust flow 402 to measure a humidity level in the chamber. Alternatively, a humidity senor 415 can be coupled to the chamber to measure a humidity level in the chamber.

In operation, a container, which can include a container body 480 and container lid 485, can be placed in the chamber 400, for example, for decontamination. The vacuum environment in the chamber 400 can remove particulates and also outgasing molecules from the container. The container can be cleaned before placing in the chamber. The container can be dried, or partially dried before placing in the chamber. Alternatively, the chamber can be used for drying the container.

In some aspects, the present embodiment discloses a low humidity chamber for decontamination. Low humidity can ensure a long term cleanliness. For example, decontaminating in high humidity environment can show a container to be cleaned, but after a certain time, moisture can be released from the container, forming particulates on stored substrates. The moisture can be absorbed on the surfaces of the container during the decontamination process. Thus decontaminating in low humidity can provide a long term cleanliness, e.g., preventing moisture or particulates from being released from the container.

In some aspects of the disclosed embodiment, the pressure in the decontamination chamber can be reduced 430, for example, from the atmospheric pressure to a base pressure. In the same time, the humidity level 450 can also reduced. The base pressure can be maintained for a time period, for example, until the time t 445, until the humidity level reaches a set point 440, such as below 10 or below 5% relative humidity level, or between 5 and 10% humidity. Thus, humidity can represent a criterion in the decontamination process, meaning the decontamination is not complete until the humidity condition is satisfied.

In some aspects of the disclosed embodiment, the humidity condition can include maintaining a low humidity environment for a time period, to ensure that the container are cleaned thoroughly.

FIGS. 5A-5B illustrate a configuration for a vacuum decontamination chamber according to some aspects of the disclosed embodiment. A chamber 500 can include a pumping mechanism for evacuating the gas inside the chamber. The pumping mechanism can form an exhaust flow 502 exiting the chamber 500. The chamber 500 can include a purging mechanism for supplying a gas flow to the chamber. The purging mechanism can form an input flow 504 to the chamber 500. A humidity sensor 510 can be coupled to the exhaust flow 502 to measure a humidity level in the chamber. Alternatively, a humidity senor 515 can be coupled to the chamber to measure a humidity level in the chamber.

In operation, a container, which can include a container body 580 and container lid 585, can be placed in the chamber 500, for example, for decontamination. The chamber can be subjected to cycles of pumping and purging, e.g., reducing the pressure inside the chamber by pumping out the gas in the chamber, and then flowing a new gas to the chamber. The purging can occur during the pumping action.

The vacuum environment in the chamber 500 can remove particulates and also outgasing molecules from the container. The purging can assist the pumping action, for example, by pushing out the contaminants.

In some aspects of the disclosed embodiment, the pressure in the decontamination chamber can be reduced 530, for example, from the atmospheric pressure to a base pressure. After a certain pumping time, a purge gas can be introduced, increasing 535 the chamber pressure. The humidity level 550 can also reduced. The base pressure can be maintained for a time period, for example, until the time t 545, until the humidity level reaches a set point 540, such as below 10 or below 5% relative humidity level, or between 5 and 10% humidity.

The humidity level can be directly measured from a hygrometer. Alternatively, the humidity level can be calculated from rates of pressure, e.g., the rate of pumping of the chamber. For example, high pumping rate 562 can indicate a low humidity level in the chamber, as compared to medium pumping rate 564 or low pumping rate 566.

Figure 6A:
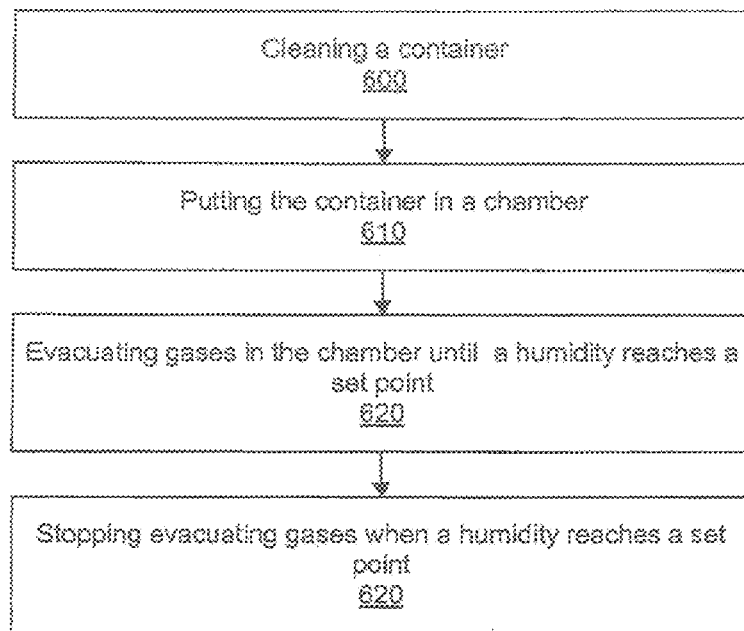
FIGS. 6A-6B illustrate flow charts for decontaminating containers according to some aspects of the disclosed embodiment.
Figure 6B:
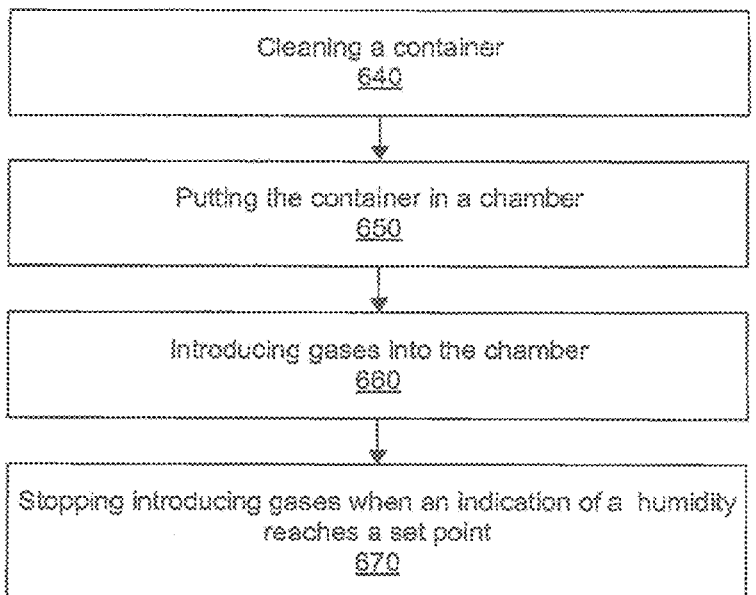

FIGS. 6A-6B illustrate flow charts for decontaminating containers according to some aspects of the disclosed embodiment. In FIG. 6A, operation 600 cleans a container. Operation 610 puts the container in a chamber. Operation 620 evacuates gases in the chamber until a humidity reaches a set point. A pump/purge action can be used for evacuating gases in the chamber. Operation 630 stops evacuating gases when a humidity reaches a set point.

In FIG. 6B, operation 650 cleans a container. Operation 660 puts the container in a chamber. Operation 670 introduces gases into the chamber. A pump/purge action can be used for supplying gases into the chamber. Operation 680 stops introducing gases when an indication of a humidity reaches a set point.

In some aspects, the presently disclosed embodiment is related to U.S. Publication No. 2012/0325271 published on Dec. 27, 2012, which is hereby incorporated by reference. The methods and systems of the present application can be applied to the aspect shown in FIG. 21, to the aspect shown in FIGS. 23A-23B, and to the aspect shown in FIG. 25 of U.S. Publication No. 2012/0325271 published on Dec. 27, 2012.

In an aspect, the present embodiment discloses a decontamination chamber to decontaminate the components after cleaning. The decontamination can employ a vacuum chamber, with high vacuum preferred, for example, less than $10^{-3}$ Torr, or preferably less than $10^{-6}$ Torr. The vacuum chamber can accelerate the outgassing of the components, removing any trapped gas within the components.

The vacuum chamber can be designed to provide configurations with effective pumping and high pumping conductance. The vacuum chamber can further comprise a heating mechanism, such as IR heaters or chamber wall heaters. The heaters can be heated to between 40 and 90 C, and preferably at about 70 C. The heating temperature depends on the materials, for example, low temperature of less than 100 C is preferred for polymer materials, and high temperature of above 100 C can be used for metal.

In an aspect of the disclosed embodiment, outgassing monitoring sensors, such as residue gas analysis (RGA), can be provided to measure the release of contaminants within the vacuum chamber, which then can be used to monitor the decontamination process.

In an aspect of the disclosed embodiment, inert purge gas is provided inside vacuum chamber, such as nitrogen gas, to back fill any gap left by the outgassing contaminants. Cyclic pressuring and vacuuming can be performed, outgassing the contaminants and then back filling with inert gas.

In an aspect of the disclosed embodiment, after decontaminate the components with high vacuum, the chamber is pressurized with nitrogen before opening, effectively coating the surfaces (and filling the subsurfaces) of the components with nitrogen molecules, further improving the cleanliness and preventing adhering particulates.

In some aspects of the disclosed embodiment, the present humidity control configuration can be applied to FIG. 21 of U.S. Pat. No. 9,312,152 issued on Apr. 12, 2016, which is hereby incorporated by reference. A vacuum chamber comprises a vacuum line connected to a vacuum pump, such as a turbo pump or a cryo pump, creating a high vacuum within the chamber. A heater is disposed in the vacuum chamber for heating the chamber and the components of a container. Sensors, such as a RGA for monitoring the outgassing species, can be included. Purge gas can provide an inert ambient to the vacuum chamber, for example, to prevent back flowing of contamination before transferring the components to the outside.

The vacuum chamber can include a humidity sensor, such as a hygrometer, that can be coupled to the chamber or to the vacuum line. The humidity sensor can present a condition or a requirement for the decontamination process, e.g., the decontamination process can continue until the humidity level drops to a set point. In some aspects, the decontamination process can further continue for a time period after reaching the humidity set point.

In an aspect, the present embodiment discloses an assembling station, preferably an integrated assembly station to assemble the separately-cleaned components under a control environment. For high level cleanliness, avoiding exposure to potential sources of contamination should be considered. Thus, after being cleaned separately, the components are assembled in a cleaned environment to maintain the level of cleanliness, for example, to minimize any contamination of the inner container by exposing to outside ambient.

In an aspect of the disclosed embodiment, the assembling station is filled with nitrogen. Thus after transferring from a vacuum decontamination chamber, which was filled with nitrogen before open to the transfer process, the components are transferred to the assembly station, which is filled with nitrogen. The assembling station therefore can preserve the cleanliness of the components after cleaning.

In an aspect, the present embodiment discloses an assembling station for assembling double container reticle carrier. The assembling station can provide an assembling process in a clean environment (preferably a nitrogen environment) with nitrogen purge between inner and outer containers.

Figure 23A:
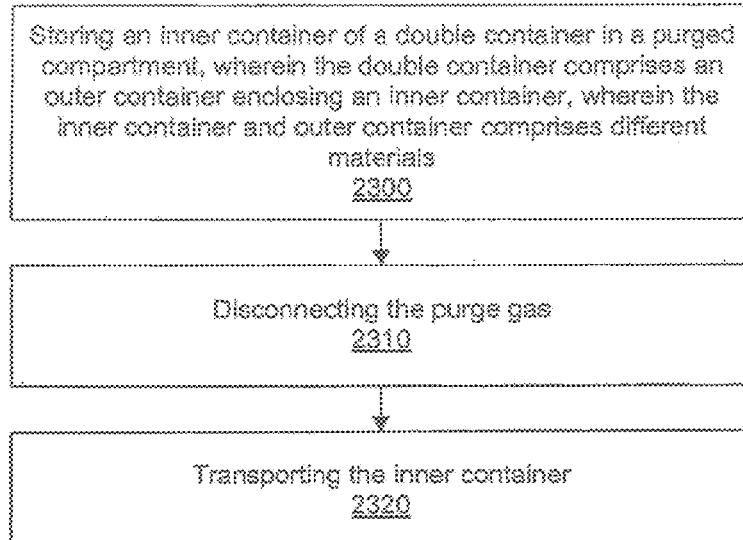
FIGS. 23A-23B illustrate flow charts for purge compartment storage according to some aspects of the disclosed embodiment.
Figure 23B:
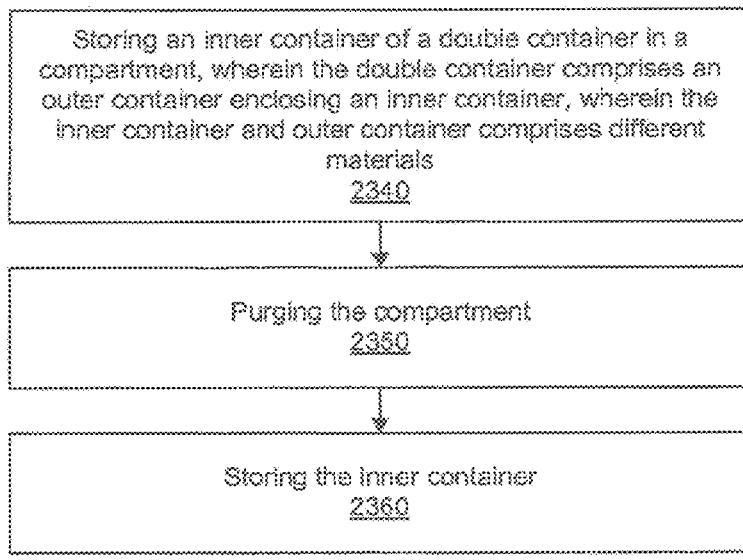

In some aspects of the presently disclosed embodiment, the present humidity control configuration can be applied to FIGS. 23A-23B of U.S. Pat. No. 9,312,152 issued on Apr. 12, 2016. The components of a container to be assembled are transferred to the assembling station, which comprises nitrogen purge gas inlet. A bottom support is placed on nitrogen nozzles. Bottom support and top lid are then placed on the bottom support. Top lid is then brought in the assembling station. With the nitrogen nozzles providing nitrogen to the bottom support, the top lid is assembled with the bottom support, effectively purging and providing nitrogen to the volume inside the outer container form by the bottom support and the top lid. With the assembling station under nitrogen ambient, and in some case, slightly pressurized, the assembling station is open and the assembled carrier is then transferred to the outside.

The nitrogen purge for the assembling station and the nitrogen nozzles for the bottom support can be recirculated, using filter and humidity sensor, together with an optional source of fresh nitrogen for controlling the humidity level. For example, the filter can be used to remove or absorb moisture in the nitrogen in the recirculation path. The humidity sensor can be coupled to the fresh nitrogen gas source, to add fresh nitrogen when the humidity level exceeds a threshold.

In an aspect, the present embodiment discloses loading and unloading station for a cleaner system with nitrogen purge to the volume inside the objects. To maintain a level of cleanliness for the object inside a carrier, the inside volume is constantly purged with inert gas such as nitrogen. Thus the present embodiment discloses an inert gas purge for a transfer and/or storage station, ensuring a constant purge of the inside volume. In some aspects, the present humidity control configuration can be applied to FIG. 25 of U.S. Pat. No. 9,312,152 issued on Apr. 12, 2016. The double container carrier is placed on nitrogen purge nozzles in the station. With the nitrogen nozzles providing nitrogen to the bottom support of the double container carrier, the volume inside the outer container is constantly purged with refreshed nitrogen.

The nitrogen purge for the bottom support can be recirculated, using filter and humidity sensor, together with an optional source of fresh nitrogen for controlling the humidity level. For example, the filter can be used to remove or absorb moisture in the nitrogen in the recirculation path. The humidity sensor can be coupled to the fresh nitrogen gas source, to add fresh nitrogen when the humidity level exceeds a threshold.

In some aspects, the present embodiment discloses processes for conditioning a container, including purging the interior of the container until the humidity level in the container is satisfactory, e.g., below a set point such as 10 or 5% relative humidity. The humidity condition can be maintained for a certain time period, to ensure that the interior of the container has acceptable humidity level. The low humidity level of the interior of the container can improve the cleanliness of the storage environment for the semiconductor substrates, which can provide a long term cleanliness environment after the container is removed from cleanliness support, such as a purge system for purging the container.

Figure 7A:
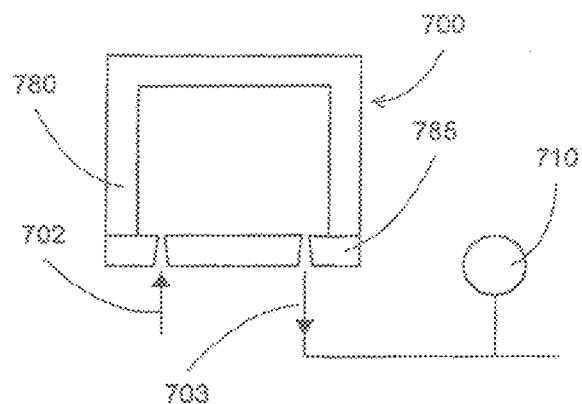
FIGS. 7A-7B illustrate a configuration for conditioning a container according to some aspects of the disclosed embodiment.
Figure 7B:
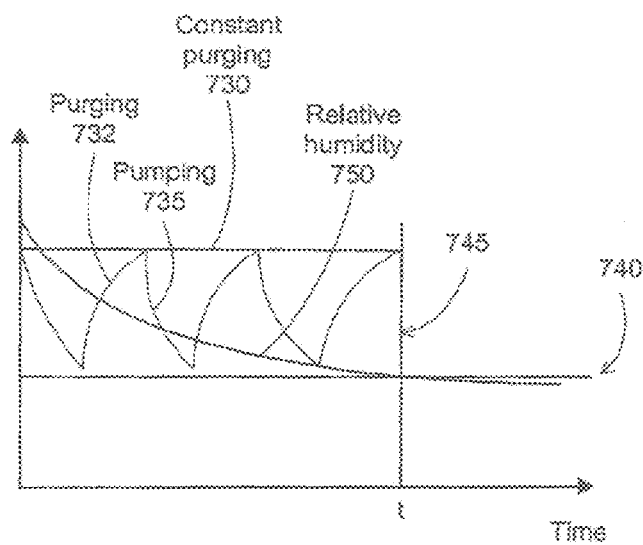

FIGS. 7A-7B illustrate a configuration for conditioning a container according to some aspects of the disclosed embodiment. A container 700 can include a purging mechanism for purging the inside of a container. The purging mechanism can include an input flow 702 providing to the container 700, which includes a lid 785 coupled to a body 780. The purging mechanism can include an exhaust flow 703 exiting the container 700. A humidity sensor 710 can be coupled to the exhaust flow 703 to measure a humidity level in the container. Alternatively, a humidity senor can be coupled to the container to measure a humidity level in the container.

In operation, a container, which can have substrates stored within, can be purged with a low humidity gas, such as dry air or dry nitrogen. A constant purging 730 can be performed, in which a flow of inactive gas can be supplied to the interior of the container. Alternatively, a pump/purge action can be performed, including a purging flow 732, followed by a pumping period 735. The constant purging or the pump/purge action can continue until a time t 745, until the humidity level reaches a set point 740, such as below 10 or below 5% relative humidity level, or between 5 and 10% humidity. Thus, humidity can represent a criterion in the purging process, meaning the purging of a container is not complete until the humidity condition is satisfied.

In some aspects of the disclosed embodiment, the humidity condition can include maintaining a low humidity environment for a time period, to ensure that the container are cleaned thoroughly. In some aspects, the present embodiment discloses a low humidity purging process for maintaining a cleanliness for a container. Low humidity can ensure a long term cleanliness for the stored substrates. For example, after finishing purging, the substrates can be kept cleaned for a long period of time if the humidity level in the container is below the set point.

FIGS. 8A-8C illustrate flow charts for conditioning a container according to some aspects of the disclosed embodiment. In FIG. 8A, operation 800 purges an interior of the container with a gas flow until a humidity level reaches a set point. In FIG. 8B, operation 820 repeats pumping and purging an interior of the container until a humidity level reaches a set point.

In FIG. 8C, operation 840 stores substrates in a container. Operation 850 introduces a gas flow into the interior of the container. Operation 860 monitors a humidity level in the exhaust stream of the gas flow. Operation 870 stops the gas flow when the humidity level reaches a set point.

In some aspects, the presently disclosed embodiment is related to U.S. Pat. No. 9,312,152 issued on Apr. 12, 2016. The methods and systems of the present application can be applied to the disclosed embodiments of U.S. Pat. No. 9,312,152 issued on Apr. 12, 2016. For example, the humidity control configurations can be applied to aspects shown in FIG. 2B, in FIGS. 3A-3B, in FIG. 5, in FIG. 7, in FIG. 8, in FIG. 10, and in FIG. 12.

In some aspects, the present embodiment discloses processes for maintaining a clean environment. The environment can be a stocker for storing containers and semiconductor substrates. The process can include forming a recirculating flow inside the stocker. The recirculating flow can include an inactive gas, such as air or nitrogen. The recirculating flow can be maintained at a constant humidity such as at 10 or 5% relative humidity. The constant humidity can be maintained by monitoring the humidity level in the stocker, and fresh dry gas can be added to the stocker when the humidity level exceeds the humidity set point. The fresh dry gas can be stopped when the humidity level returns below the set point. Thus the humidity can be constant in a time interval, e.g., the average humidity level in the time interval, and the instantaneous humidity can be fluctuated around the set point. In addition, the recirculating flow can be filtered to remove particulates and moisture. The low humidity level of the stocker can improve the cleanliness of the storage environment for the stored semiconductor substrates.

Figure 9A:
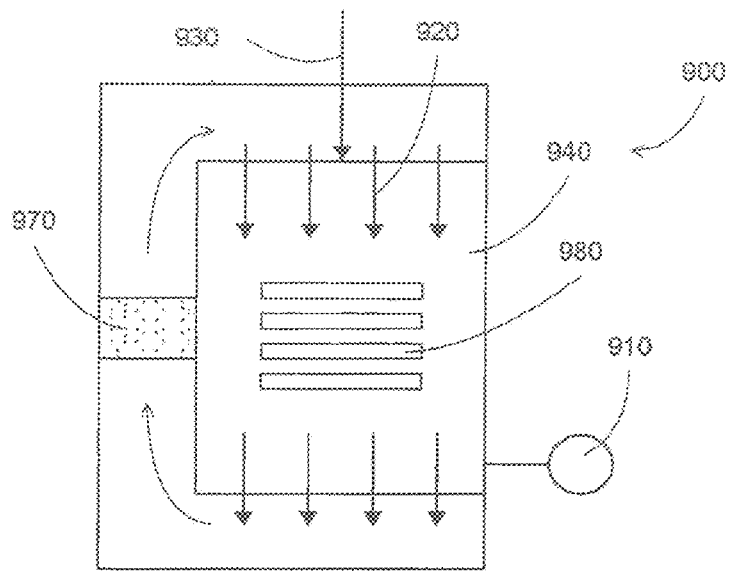
FIGS. 9A-9B illustrate a configuration for conditioning a stocker according to some aspects of the disclosed embodiment.
Figure 9B:
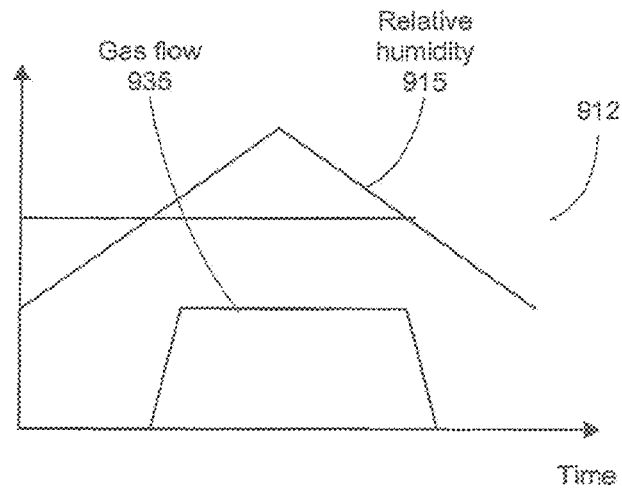

FIGS. 9A-9B illustrate a configuration for conditioning a stocker according to some aspects of the disclosed embodiment. A stocker 900 can include a storage chamber 940, which can be used to store semiconductor substrates 980, such as silicon wafers or reticles. As shown, the substrates 980 are stored bared in the storage chamber 940. In some aspects of the disclosed embodiment, the substrates can be stored in containers, which are then stored in the storage chamber.

To maintain a clean environment in the storage chamber, a purge gas 920 can be provided. The purge gas can include a laminar flow, flowing without any turbulent or dead spaces, for example, to prevent particulates from contaminating the substrates.

In some aspects of the disclosed embodiment, the purge gas can be recirculated, for example, to reduce the consumption of gas. The recirculation can be continuous, e.g., the gas is continuously circulated on the storage chamber. The recirculation can be intermittent, e.g., the recirculated gas can stopped for a time period before resuming flow. A filter 970 for filtering moisture of the recirculated gas can be provided, for example, in the recirculation path to reduce moisture in the recirculated gas. A humidity sensor 910, such as a hygrometer, can be coupled to the storage chamber (or to the recirculation path of the recirculated gas). A gas inlet 930 can be coupled to the storage chamber, for example, to provide a fresh dry gas 935 to the storage chamber. The fresh dry gas can be in inactive gas, such as air or nitrogen. The fresh dry gas can have low humidity, such as less than 5 or less than 2% humidity.

The gas inlet 930 can be linked to the humidity sensor 910 to provide a gas flow 935 when the sensor indicates that the humidity level exceeds a set point 912, such as greater than 10% or greater than 5% relative humidity. In some aspects, the gas flow 935 can flow when the humidity level exceeds a high level of humidity, such as 6, 7, 8, 9 or 10%. The gas flow 935 can stop when the humidity level drops below a low level of humidity, such as 5, 6, 7, 8, or 9%. For example, the high level can be 6% humidity and the low level can be 5% humidity. Thus the humidity level in the storage chamber can fluctuate between 5 and 6% humidity levels.

In some aspects of the disclosed embodiment, the semiconductor substrates can be stored in protective containers, with the containers stored in the storage chamber. A purge gas can be provided in the storage chamber to prevent contamination of the protective containers stored therein. Another purge gas can be provided in the protective containers to prevent contamination of the substrates stored therein. Either one or both of the purge gases can be recirculated. Humidity sensor can be used to regulate the humidity level in the storage chamber or in the protective containers.

Figure 10A:
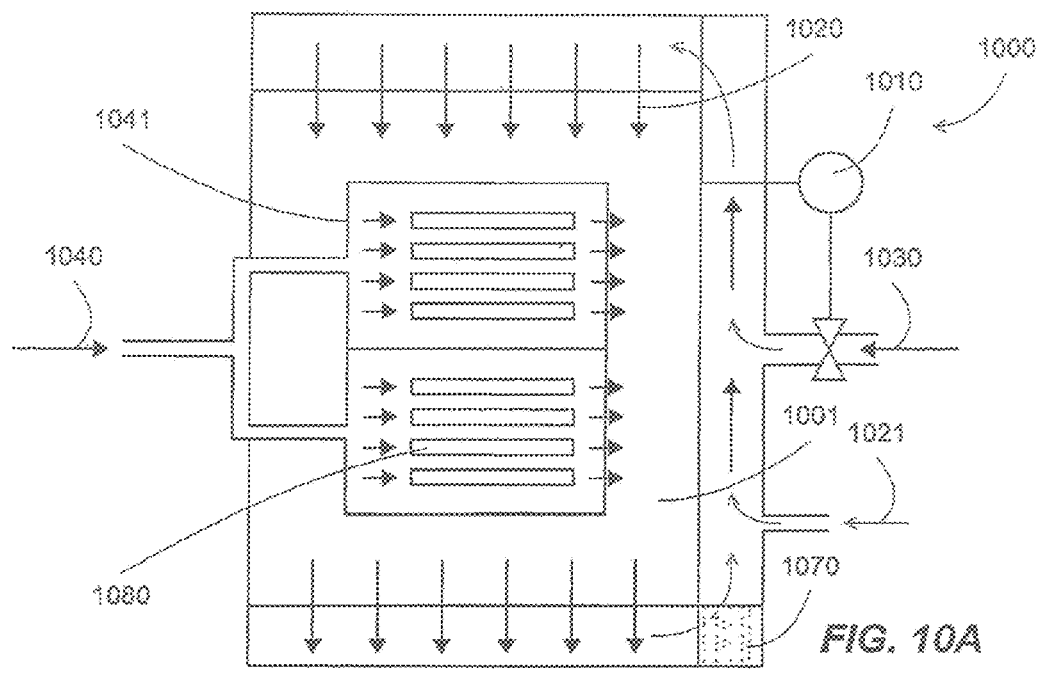
FIGS. 10A-10B illustrate stocker configurations with humidity control according to some aspects of the disclosed embodiment.
Figure 10B:
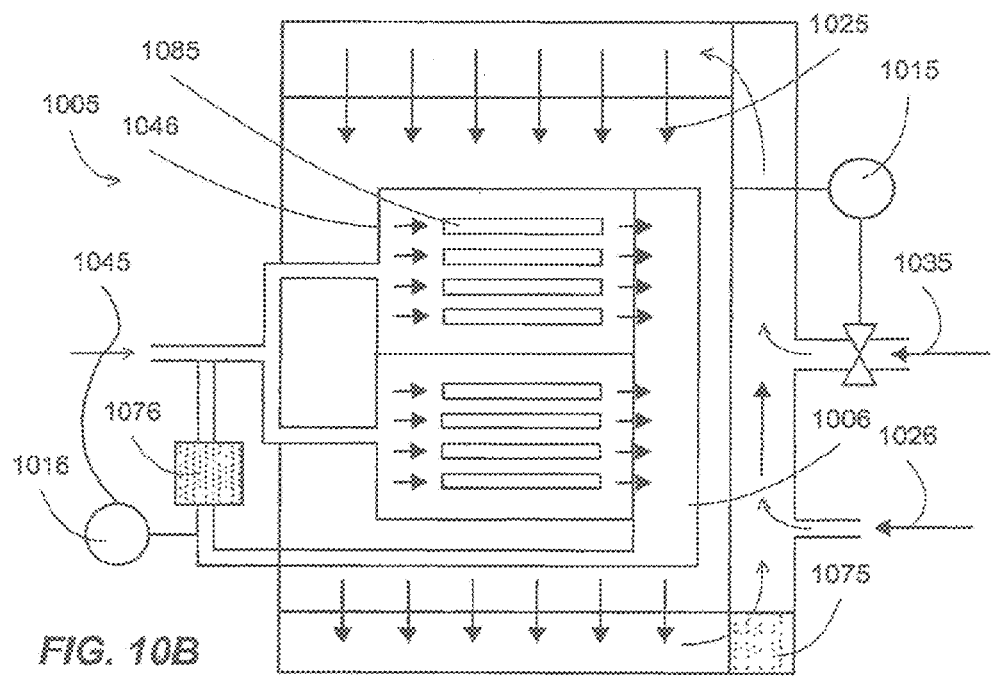

FIGS. 10A-10B illustrate stocker configurations with humidity control according to some aspects of the disclosed embodiment. In FIG. 10A, a stocker 1000 can include a storage chamber 1001 for storing protective containers 1041. Multiple semiconductor substrates 1080 can be stored in the protective containers 1041. A laminar purge flow 1020 can be provided in the storage chamber 1001 to provide a clean environment for the protective containers 1045. The purge flow 1020 can be recirculated, with a moisture filter 1070 disposed in the recirculation path to reduce the moisture content in the recirculated purge flow. In some aspects, an optional gas flow 1021 can be added to the recirculation path, for example, to compensate for any gas loss in the recirculation path, and/or to maintain a positive pressure, e.g., a higher than atmospheric pressure, in the storage chamber 1001. A humidity sensor 1010 can be coupled to the storage chamber 1001 to measure the humidity in the storage chamber. Alternatively, the humidity can be coupled to any location on the recirculation path to measure the humidity in the recirculated gas. The humidity sensor 1010 can be used to control a fresh dry gas 1030 to regulate the humidity level in the storage chamber. For example, if the humidity exceeds an upper level, the fresh dry gas 1030 can start until the humidity drops below a lower level of humidity.

A purge gas 1040 can be used to provide a clean environment for the protective containers 1041. The purge gas 1040 can flow pass the semiconductor substrates, and then merge with the purge flow in the storage chamber.

In FIG. 10B, a stocker 1005 can include a storage chamber 1006 for storing protective containers 1046. Multiple semiconductor substrates 1085 can be stored in the protective containers 1046. A laminar purge flow 1025 can be provided in the storage chamber 1006 to provide a clean environment for the protective containers 1046. The purge flow 1025 can be recirculated, with a moisture filter 1075 disposed in the recirculation path to reduce the moisture content in the recirculated purge flow. In some aspects, an optional gas flow 1026 can be added to the recirculation path, for example, to compensate for any gas loss in the recirculation path, and/or to maintain a positive pressure, e.g., a higher than atmospheric pressure, in the storage chamber 1006. A humidity sensor 1015 can be coupled to the storage chamber 1006 to measure the humidity in the storage chamber. Alternatively, the humidity can be coupled to any location on the recirculation path to measure the humidity in the recirculated gas. The humidity sensor 1015 can be used to control a fresh dry gas 1035 to regulate the humidity level in the storage chamber. For example, if the humidity exceeds an upper level, the fresh dry gas 1035 can start until the humidity drops below a lower level of humidity.

A purge gas 1045 can be used to provide a clean environment for the protective containers 1046 The purge gas 1045 can flow pass the semiconductor substrates, and then recirculated back to the protective containers 1046, with a moisture filter 1076 disposed in the recirculation path to reduce the moisture content in the recirculated purge flow. A humidity sensor 1016 can be coupled to a location on the recirculation path to measure the humidity in the recirculated gas. The humidity sensor 1016 can be used to control the flow of the purge gas 1045 to regulate the humidity level in the protective containers. For example, the purge gas 1045 have a normal flow rate. If the humidity exceeds an upper level, the purge gas 1045 can increase above the normal flow rate until the humidity drops below a lower level of humidity, Afterward, the purge gas 1045 can return to the normal flow rate. The process can be repeated, which can control the humidity of the interior of the protective containers to be between the lower and upper levels.

FIGS. 11A-11B illustrate flow charts for conditioning a stocker according to some aspects of the disclosed embodiment. In FIG. 11A, operation 1100 introduces a fresh dry gas flow into a chamber when a humidity level in the chamber exceeds a set point.

In FIG. 11B, operation 1120 stores workpieces in a chamber. Operation 1130 optionally purges the workpieces. Operation 1140 recirculates gases inside the chamber. Operation 1150 monitors a humidity level in the chamber. Operation 1160 introduces a fresh gas flow into the chamber when the humidity level exceeds a set point.

In some aspects, the presently disclosed embodiment is related to U.S. Pat. No. 9,536,763 issued on Jan. 3, 2017 which is hereby incorporated by reference. The methods and systems of the present application can be applied to the aspect shown in FIGS. 2A-2B, FIGS. 3 A-3B, to the aspect shown in FIG. 7, FIG. 8, and to the aspect shown in FIG. 19 of U.S. Pat. No. 9,536,763.

The nitrogen purge can be recirculated, using filter and humidity sensor, together with an optional source of fresh nitrogen for controlling the humidity level. For example, the filter can be used to remove or absorb moisture in the nitrogen in the recirculation path. The humidity sensor can be coupled to the fresh nitrogen gas source, to add fresh nitrogen when the humidity level exceeds a threshold.

In some aspects, the present embodiment discloses a purge gas system for maintaining a clean environment. The purge gas system can be controlled by a humidity sensor, e.g., supplying a fresh dry gas to the environment when the humidity level exceeds a threshold. The purge gas system can include a recirculation pathway for recirculating the gas inside the environment. The recirculation pathway can include an additional fresh dry gas supply, for example, to compensate for any gas loss in the recirculation path.

Figure 12A:
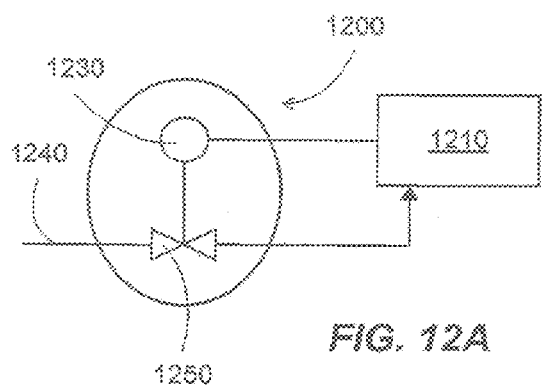
FIGS. 12A-12C illustrate purge gas configurations according to some aspects of the disclosed embodiment.
Figure 12B:
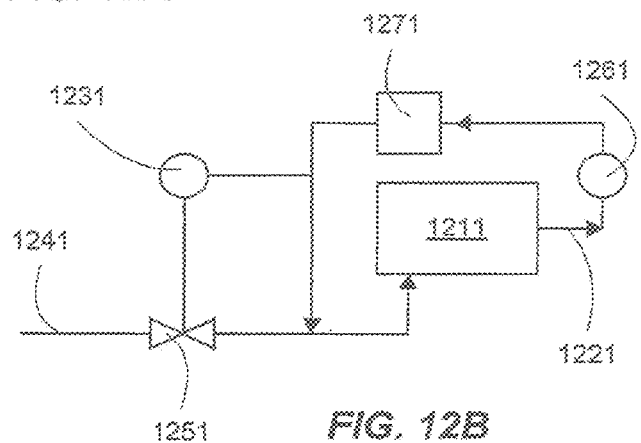
Figure 12C:
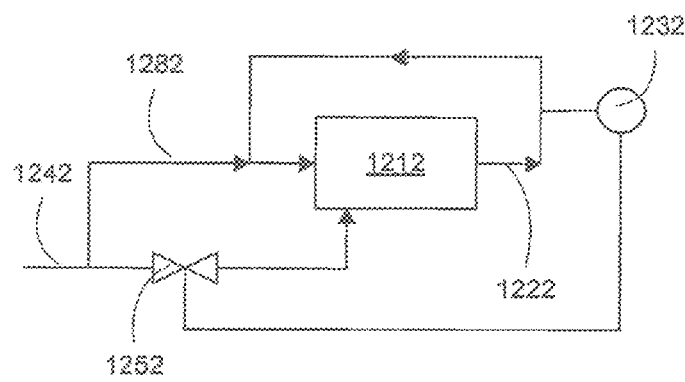

FIGS. 12A-12C illustrate purge gas configurations according to some aspects of the disclosed embodiment. In FIG. 12A, a purge gas system 1200 can include a gas source that is controlled by a humidity sensor. For example, a gas source can be configured to supply a fresh dry gas 1240, e.g., nitrogen or air. A valve 1250 can be coupled to the gas flow path to turning on or off the gas flow 1240. A humidity sensor 1230 can be coupled to an environment 1210, such as a container or a chamber. The valve 1250 can be controlled by the humidity sensor, e.g., the valve can be turned on (gas 1240 can flow) when the humidity in the environment 1210, measured by the humidity sensor 1230, exceeds a first threshold level, such as above 10% or about 5% relative humidity. The valve 1250 can be turned off when the humidity in the environment 1210, measured by the humidity sensor 1230, drops below a second threshold level, such as below 10% or below 5% relative humidity. Any other ranges of humidity can be used, such as between 10 and 5%, or between 6 and 5% relative humidity.

FIG. 12B shows another configuration of a purge gas system, which can include a recirculation gas path 1221. Thus a purge gas can be recirculated in the environment 1211, with the purge gas filtered by a filter 1271 (such as particulate filter and/or moisture filter). The recirculating gas path can be formed by a pump system 1261. A humidity sensor 1231 can be coupled to the recirculating gas path. A valve 1251 can be coupled to a fresh dry gas 1241, and can be controlled by the humidity sensor, e.g., the valve can be turned on (gas 1241 can flow) when the humidity in the environment 1211, measured by the humidity sensor 1231, exceeds a first threshold level, such as above 10% or about 5% relative humidity. The valve 1251 can be turned off when the humidity in the environment 1211, measured by the humidity sensor 1231, drops below a second threshold level, such as below 10% or below 5% relative humidity.

FIG. 12C shows another configuration of a purge gas system, which can include a recirculation gas path 1221 with fresh dry gas flow 1282. Thus a purge gas can be recirculated in the environment 1212, with the purge gas filtered by a filter 1272 (such as particulate filter and/or moisture filter). The recirculating gas path can be formed by a pump system 1262. Fresh dry gas 1282 can be added to the recirculating gas path, for example, to compensate for gas loss or to reduce the increase of moisture in the environment 1212.

A humidity sensor 1232 can be coupled to the recirculating gas path. A valve 1252 can be coupled to a fresh dry gas 1242, and can be controlled by the humidity sensor, e.g., the valve can be turned on (gas 1242 can flow) when the humidity in the environment 1212, measured by the humidity sensor 1232, exceeds a first threshold level, such as above 10% or about 5% relative humidity. The valve 1252 can be turned off when the humidity in the environment 1212, measured by the humidity sensor 1232, drops below a second threshold level, such as below 10% or below 5% relative humidity.

In some aspects, the present embodiment discloses processes and systems for high level cleanliness articles, such as extreme ultraviolet (EXJY) reticle carriers. The following description uses EUV reticle carriers are example, but the present embodiment is not so limited, and can be applied toward any objects having stringent cleanliness requirements, such as low particulate contaminations and low outgassing components.

Figure 13A:
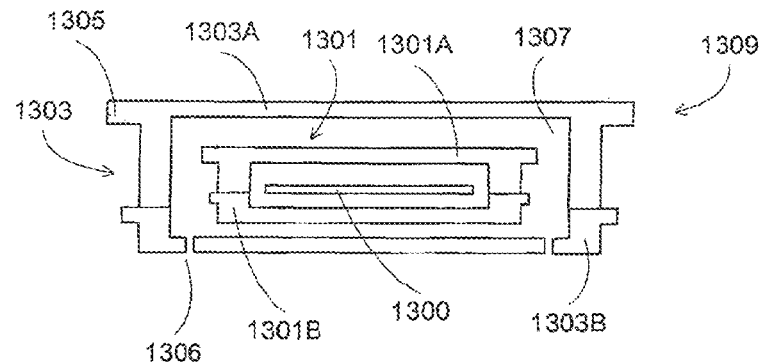
FIGS. 13A-13B illustrate a configuration for storing EUV reticle carriers according to some aspects of the disclosed embodiment.
Figure 13B:
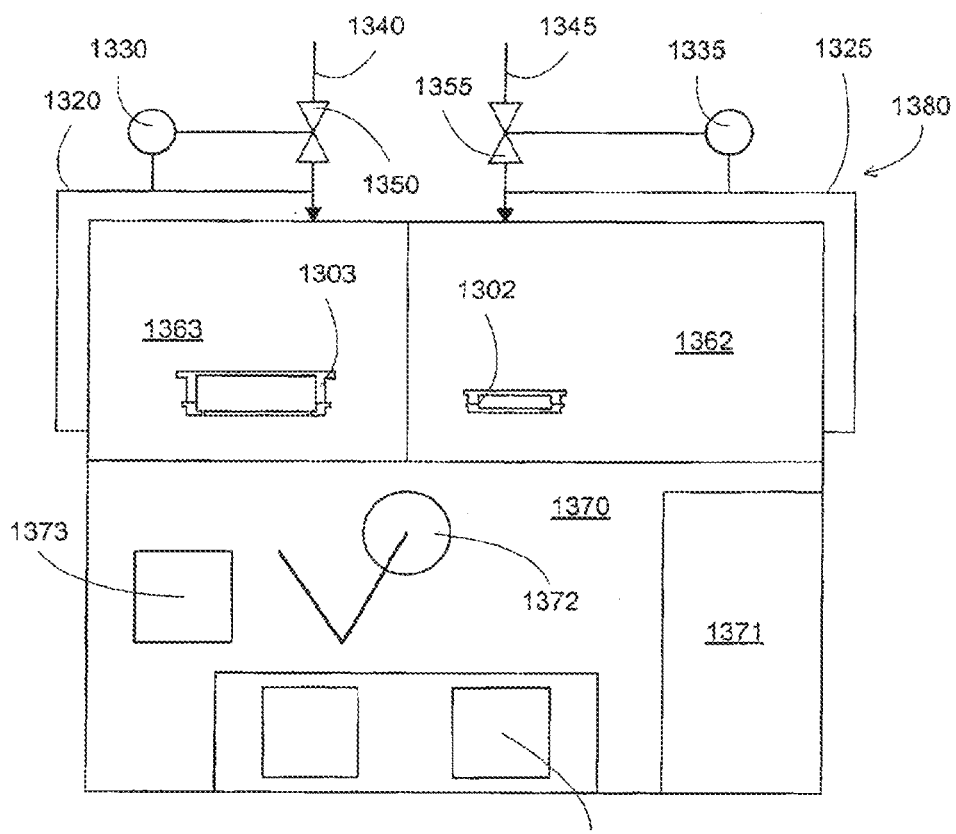

FIGS. 13A-13B illustrate a configuration for storing EUV reticle carriers according to some aspects of the disclosed embodiment. In FIG. 13A, an EUV reticle 1300 can be stored in a double-container carrier 1309, together with having nitrogen in the space 1307 between an inner container 1301 and an outer container 1303. The inner container can be made of metal, such as aluminum, and can include an upper lid 1301 mated with a lower support 1302. An outer container is typically made of low outgassing polymer, comprising an upper lid 1303A mated with a lower support 1303B. Both containers can have handles for holding by an operator or by an automatic transport system. A handle 1305 is shown for the upper lid 1303A of the outer container. The support 1303B of the outer container can have inlets 1306 for accepting nitrogen purge to the inner volume 1307 of the reticle carrier.

The double container euv reticle carrier is an example of the high level of cleanliness for semiconductor processing, where the reticle is stored in two levels of container to prevent contamination. In addition, the volume between the two levels can be filled or purged with nitrogen to avoid bacteria growth, or to prevent outgassing particles from the outer container to attach to the inner container. The volume in the inner container can also be filled or purged with nitrogen. As shown, the inner container is filled with nitrogen, e.g., there is no inlets for nitrogen purge of the interior of the inner container. Alternatively, there can be inlets for the inner container, for example, similar to inlets 1306 for the outer container.

In some aspects, the present embodiment discloses a storage system for storing the double containers, such as storing the empty euv reticle carriers and the euv reticle carriers having the reticles stored therein. The storage system can store separately the inner containers and the outer containers to avoid cross contamination between the two containers. For example, the outer containers can have a higher outgassing rate than the inner container, due to the difference in materials. Thus by storing the containers separately, desired levels of cleanliness for the reticles can be maintained.

The storage system can include two separate storage chambers, which are coupled only at the container transfer level. Each storage chamber can be purged, for example, with inactive gas such as air or nitrogen. Humidity sensors can be coupled to the storage chambers to maintain the storage chambers at a constant range of humidity. The purged gas can be recirculated with optional fresh gas inlet, for example, to compensate for any gas loss or to maintain a positive pressure in the storage chambers. Humidity sensors can be coupled to the storage chambers or to the recirculated loop. The humidity sensors can be coupled to another fresh dry gas source, such as to control the flow of the gas source, to maintain the humidity level in the storage chambers at a set point or in a range of humidity.

FIG. 13B shows a stocker having two separate storage chambers. A stocker 1380 can include a storage chamber 1363 for outer container storage, and storage chamber 1362 for inner container storage, and portion 1370 for substrate and container handling. The storage chamber can be used to store inner containers, or inner containers with substrates stored therein. Loading stations 1377 are configured for manual or automatic loading and unloading containers. Transfer station 1373 is optionally included for either container or workpiece support. Robot 1372 can handle workpieces and workpiece containers between loading station 1377 and storage chambers 1375 and 1376. Controller 1371 contains programs, sensors and commands to operate the stocker.

The storage chambers can be purged with humidity control. For example, storage chamber 1363 can have a recirculation loop 1320. A fresh dry gas source 1340 can be coupled to the storage chamber and to the recirculation loop. A humidity sensor 1330 can be coupled to the recirculation loop, and can be used to control a valve 1350 for regulating the gas source 1340. For example, if the humidity level in the storage chamber 1363, measured in the recirculation loop, exceeds a higher limit, the valve 1350 can be open to allow fresh dry gas to enter the storage chamber, thus reducing the humidity in the chamber. After the humidity reduces, for example, below a lower limit, the valve 1350 can be close. Thus the humidity in the storage chamber 1363 can be controlled to be in a range between the lower limit and the higher limit.

Similarly, storage chamber 1362 can have a recirculation loop 1325. A fresh dry gas source 1345 can be coupled to the storage chamber and to the recirculation loop. A humidity sensor 1335 can be coupled to the recirculation loop, and can be used to control a valve 1355 for regulating the gas source 1345. For example, if the humidity level in the storage chamber 1362, measured in the recirculation loop, exceeds a higher limit, the valve 1355 can be open to allow fresh dry gas to enter the storage chamber, thus reducing the humidity in the chamber. After the humidity reduces, for example, below a lower limit, the valve 1355 can be close. Thus the humidity in the storage chamber 1362 can be controlled to be in a range between the lower limit and the higher limit.

The levels of cleanliness between the two storage chambers can be different. For example, the storage chamber 1362 for storing the inner containers can be cleaner than storage chamber 1363, since it is used to store the substrates.

In some aspects of the disclosed embodiment, the stocker can have three separate storage chambers for storing outer containers, inner containers, and substrates (such as reticles). Alternatively, the stocker can have two storage chambers for storing outer containers, and inner containers, with the inner container having substrates stored therein.

Figure 14A:
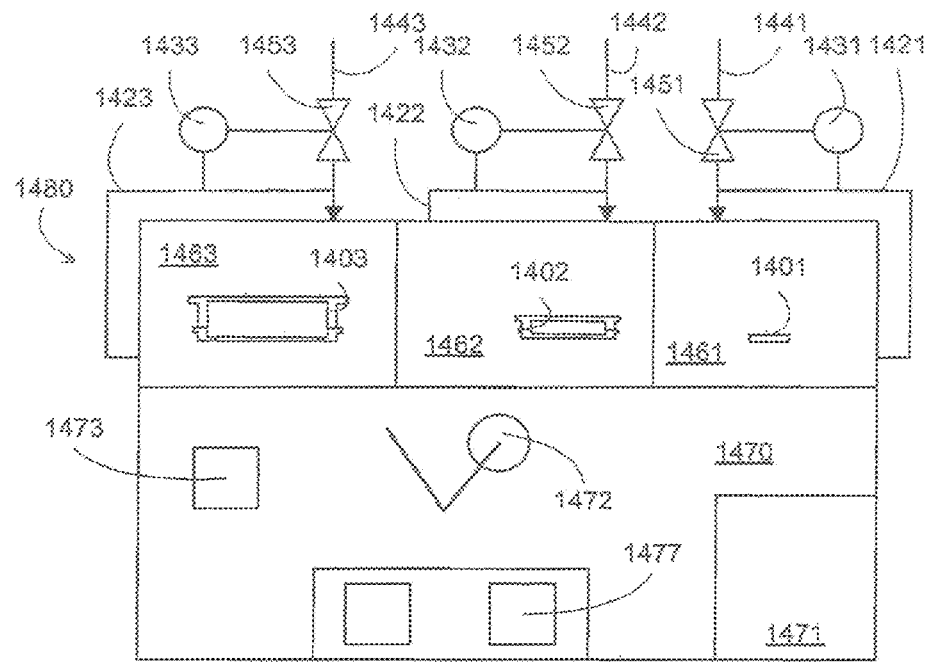
FIGS. 14A-14B illustrate stockers having different separate storage chamber configurations according to some aspects of the disclosed embodiment.
Figure 14B:
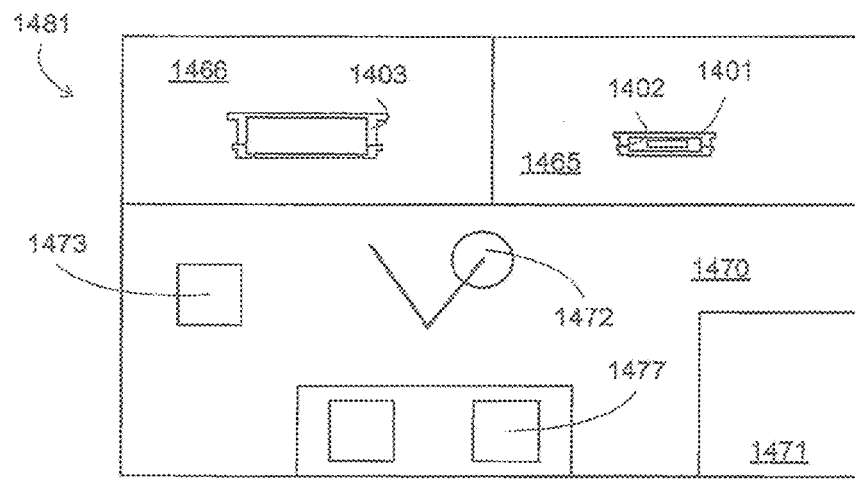

FIGS. 14A-14B illustrate stockers having different separate storage chamber configurations according to some aspects of the disclosed embodiment. In FIG. 14A, a stocker 1480 can include a storage chamber 1463 for outer container storage, storage chamber 1462 for inner container storage, storage chamber 1461 for substrate storage, and portion 1470 for substrate and container handling. Loading stations 1477 are configured for manual or automatic loading and unloading containers. Transfer station 1473 is optionally included for either container or workpiece support. Robot 1472 can handle workpieces and workpiece containers between loading station 1477 and storage chambers 1475 and 1476. Controller 1471 contains programs, sensors and commands to operate the stocker.

The storage chambers can be purged with humidity control. For example, storage chamber 1463/1462/1461 can have a recirculation loop 1423/1422/1421. A fresh dry gas source 1443/1442/1441 can be coupled to the storage chamber and to the recirculation loop. A humidity sensor 1433/1432/1431 can be coupled to the recirculation loop, and can be used to control a valve 1453/1452/1451 for regulating the gas source 1433/1432/1431. For example, if the humidity level in the storage chamber 1463/1462/1461, measured in the recirculation loop, exceeds a higher limit, the valve 1453/1452/1451 can be open to allow fresh dry gas to enter the storage chamber, thus reducing the humidity in the chamber. After the humidity reduces, for example, below a lower limit, the valve 1453/1452/1451 can be close. Thus the humidity in the storage chamber 1463/1462/1461 can be controlled to be in a range between the lower limit and the higher limit. Even though the figure shows similar configurations for the storage chambers, there can be additional features or modifications to the chambers, for example, depending on the desired levels of cleanliness. For example, purged compartments can be added to the storage chamber that houses the inner containers or the substrates, since these components require higher degrees of cleanliness. Further, the containers are shown in close configurations, but other configurations can be used, such as open configurations, e.g., the upper lid and the bottom support of a container can be separate to allow purging the inner portion of the container. Alternatively, a close container can have purge gas supplied to the interior, for example, through purge ports in the container bottom support.

In FIG. 14B, a stocker 1481 can include a storage chamber 1466 for outer container storage, storage chamber 1465 for inner container storage, and portion 1470 for substrate and container handling. The storage chamber can be used to store inner containers with substrates stored therein. Loading stations 1477 are configured for manual or automatic loading and unloading containers. Transfer station 1473 is optionally included for either container or workpiece support. Robot 1472 can handle workpieces and workpiece containers between loading station 1477 and storage chambers 1475 and 1476. Controller 1471 contains programs, sensors and commands to operate the stocker.

The storage chambers can be purged with humidity control. For example, storage chamber can have a recirculation loop. A fresh dry gas source can be coupled to the storage chamber and to the recirculation loop. A humidity sensor can be coupled to the recirculation loop, and can be used to control a valve for regulating the gas source. For example, if the humidity level in the storage chamber, measured in the recirculation loop, exceeds a higher limit, the valve can be open to allow fresh dry gas to enter the storage chamber, thus reducing the humidity in the chamber. After the humidity reduces, for example, below a lower limit, the valve can be close. Thus the humidity in the storage chamber can be controlled to be in a range between the lower limit and the higher limit. Even though the figure shows similar configurations for the storage chambers, there can be additional features or modifications to the chambers, for example, depending on the desired levels of cleanliness.

Figure 15A:
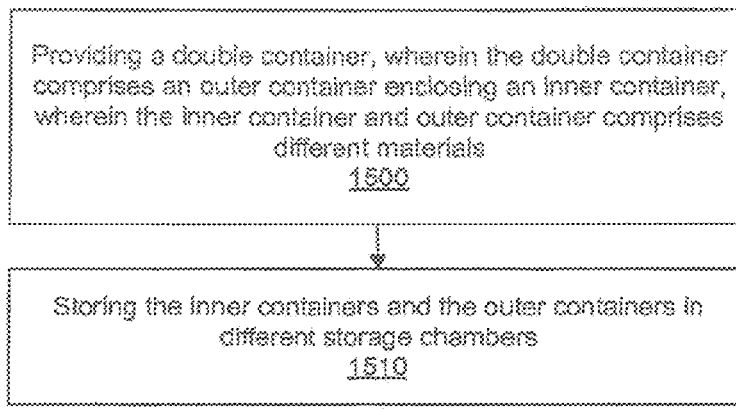
FIGS. 15A-15B illustrate flow charts for storing double containers according to some aspects of the disclosed embodiment.
Figure 15B:
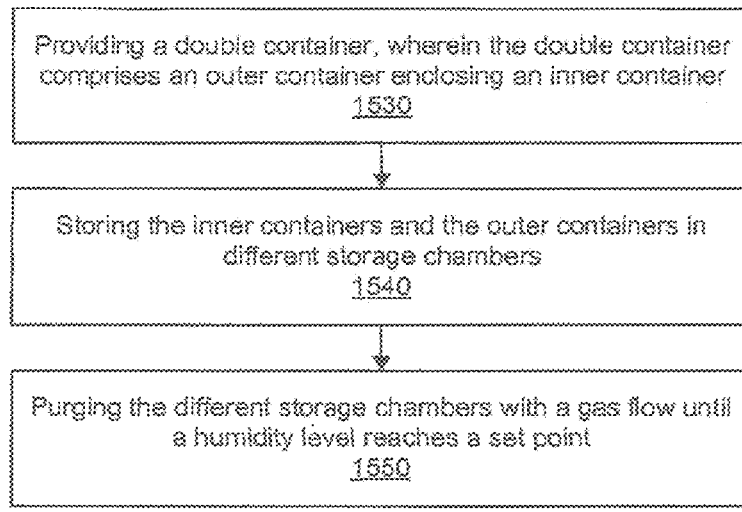

FIGS. 15A-15B illustrate flow charts for storing double containers according to some aspects of the disclosed embodiment. In FIG. 15A, operation 1500 provides a double container, wherein the double container comprises an outer container enclosing an inner container, wherein the inner container and outer container comprises different materials. Operation 1510 stores the inner containers and the outer containers in different storage chambers.

In FIG. 15B, operation 1530 provides a double container, wherein the double container comprises an outer container enclosing an inner container. Operation 1540 stores the inner containers and the outer containers in different storage chambers. Operation 1550 purges the different storage chambers with a gas flow until a humidity level reaches a set point.

In some aspects, the present embodiment discloses a stocker having a storage chamber for storing inner containers (with or without the substrates storing in the inner containers) and a buffer storage assembly for storing outer containers. The buffer storage assembly can have a typical cleanliness, e.g., for storing polymer based outer containers. The storage chamber can be modified for improved cleanliness, e.g., for storing metal based inner containers.

The stocker can be similar to the stocker described in FIG. 1 of U.S. Pat. No. 8,888,434 issued on Nov. 18, 2014, hereby incorporated by reference in its entirety.

In some aspects of the disclosed embodiment, the buffer storage assembly can include a storage chamber and a robot system interfacing with the storage chamber. The robot system can further access the load lock stations (e.g., loading or unloading stations), or any intermediate station (such as a transfer station or an exchange station) of the equipment, to transfer objects between the storage chamber and a station of the equipment. For example, the buffer storage assembly can be installed adjacent to the equipment, at a side of the equipment and near the load lock station of the equipment. The robot arm can be configured to reach into the load lock station, to pick up a container from the load lock station to bring to the storage chamber, or to place a container to the load lock station taken from the storage chamber.

Figure 16A:
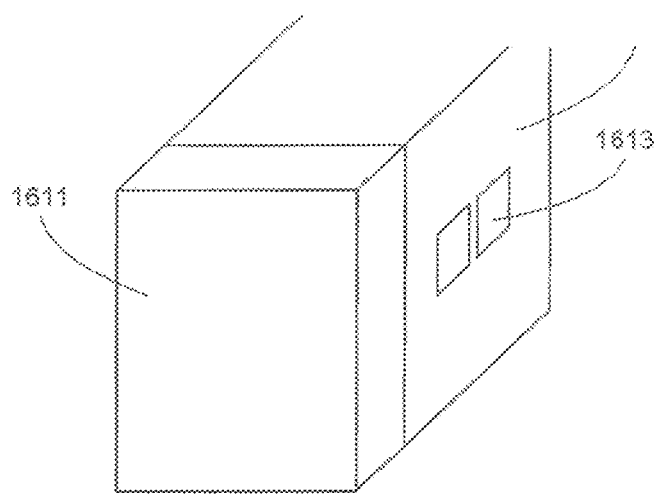
FIGS. 16A-16C illustrate a configuration of a stocker having a buffer storage assembly according to some aspects of the disclosed embodiment.
Figures 16B, 16C:
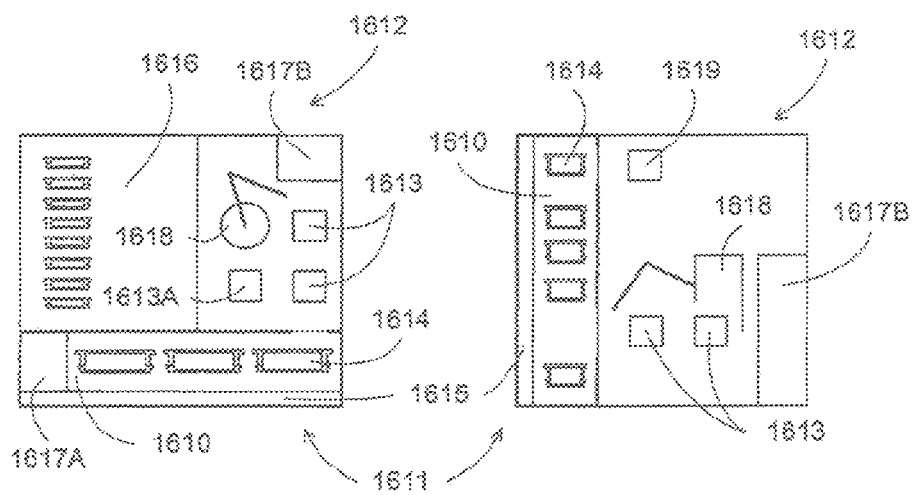

FIGS. 16A-16C illustrate a configuration of a stocker having a buffer storage assembly according to some aspects of the disclosed embodiment. In FIG. 16A, an outer container add-on storage 1611 is coupled to a inner container stocker 1612 having loading stations 1613. The term loading station is used in the context of the presently disclosed embodiment as a station supporting a container, for example, a manual I/O station (e.g., station for loading to and unloading containers from the stocker 1612 by an operator), an automatic I/O station (e.g., station for loading to and unloading containers from the stocker 1612 by an automatic overhead transport system), or an intermediate or an interface station within the stocker 1612, serving to support a container as a transitioning station between the I/O station and the stocker system. For example, an outer container can be loaded to the I/O station (manual or automatic), and then transferred to an intermediate station, where the outer container is open for a robot to access an inner container within.

In some aspects of the disclosed embodiment, the stocker 1612 is a standalone stocker, capable of independent operation, with manual or automatic I/O stations for interfacing with other equipment in a fabrication facility. The stocker accepts inner containers having substrates stored within. The outer container add-on storage 1611 can be affixed to a side of the stocker, acting as an external storage for the stocker. The coupling between the outer container add-on 1611 and the stocker 1612 can include mating a robot arm of the outer container add-on storage 1611 with the loading stations 1613 of the stocker 1612, so that the outer container add-on storage 1611 can access the containers in the loading stations 1613, for example, to pickup a container in the loading station 1613 to store in a storage chamber of the container add-on assembly 1611, or to place a container to the loading station 1613 from a storage chamber of the outer container add-on assembly 1611.

In an exemplary process flow, a container is bought to the workpiece stocker 1612, and the inner container within the container is removed and stored in the stocker 1612. The robot of the outer container add-on storage then picks up the outer container and stores it in the outer container storage chamber of the outer container add-on storage 1611.

FIGS. 16B and 16C show a top view and a front view, respectively, of the add-on storage 1611 affixed to a stocker 1612. stocker 1612 can include manual I/O stations 1613 for accepting containers, a storage chamber 1616, and a robot 1618 to transfer containers between the I/O stations 1613 and the storage chamber 1616. Additional stations can be included, such as automatic overhead I/O station 1619 for coupling with automatic overhead transport system, and intermediate station 1613A, which can serve as an interface station for containers. For example, a container in I/O station 1613 can be brought to the interface station 1613 A, where its lid can be open, and the inner container accessed by the robot 1618.

Outer container add-on storage assembly 1611 can include a robot assembly 1615 and a plurality of shelves 1614 for storing the outer containers. Robot assembly 1615 is configured to access the outer containers in shelves 1614 and also in loading stations 1613 and 1613A of the stocker 1612. Add-on storage assembly 1611 also can include a controller 1617A for controlling its operations. The controller 1617A can have similar functions as controller 1617B of the stocker 1612. The controller 1617A can communicate with controller 1617B to get the information, or can communicate with the facility computer.

The storage chamber can be used to store empty inner containers, or inner containers having substrates therein. Alternatively, the storage chamber can be used to store inner containers and substrates separately, for example, by having two separate storage chambers.

Figure 17A:
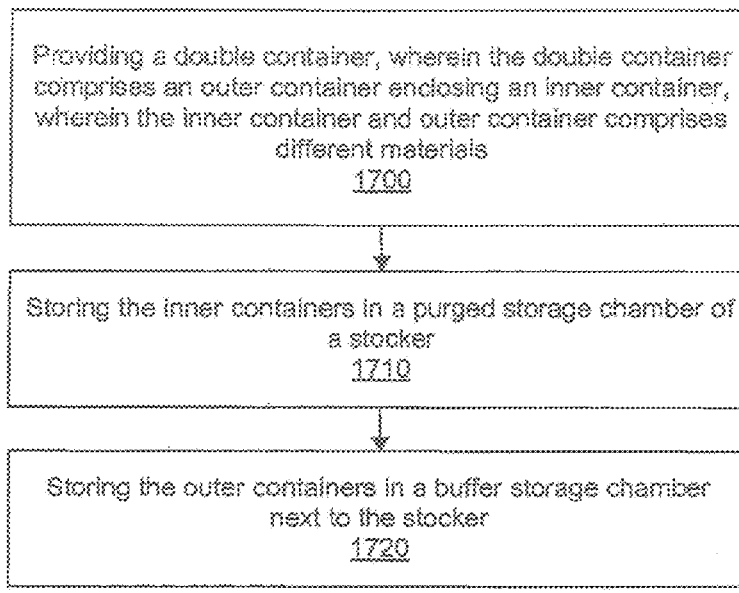
FIGS. 17A-17B illustrate flow charts for storing double containers according to some aspects of the disclosed embodiment.
Figure 17B:
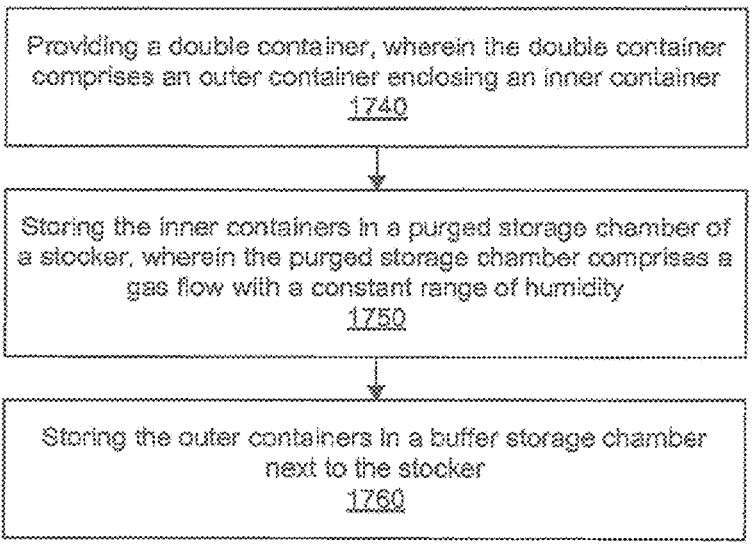

FIGS. 17A-17B illustrate flow charts for storing double containers according to some aspects of the disclosed embodiment. In FIG. 17A, operation 1700 provides a double container, wherein the double container comprises an outer container enclosing an inner container, wherein the inner container and outer container comprises different materials. Operation 1710 stores the inner containers in a purged storage chamber of a stocker. Operation 1720 stores the outer containers in a buffer storage chamber next to the stocker.

In FIG. 17B, operation 1740 provides a double container, wherein the double container comprises an outer container enclosing an inner container. Operation 1750 stores the inner containers in a purged storage chamber of a stocker, wherein the purged storage chamber comprises a gas flow with a constant range of humidity. Operation 1760 stores the outer containers in a buffer storage chamber next to the stocker.

In some aspects of the disclosed embodiment, the inner containers can be stored in protective containers, with the protective containers stored in the storage chamber. A purge gas can be provided in the storage chamber to prevent contamination of the protective containers stored therein. Another purge gas can be provided in the protective containers to prevent contamination of the inner containers stored therein. Either one or both of the purge gases can be recirculated. Humidity sensor can be used to regulate the humidity level in the storage chamber or in the protective containers.

Figure 18:
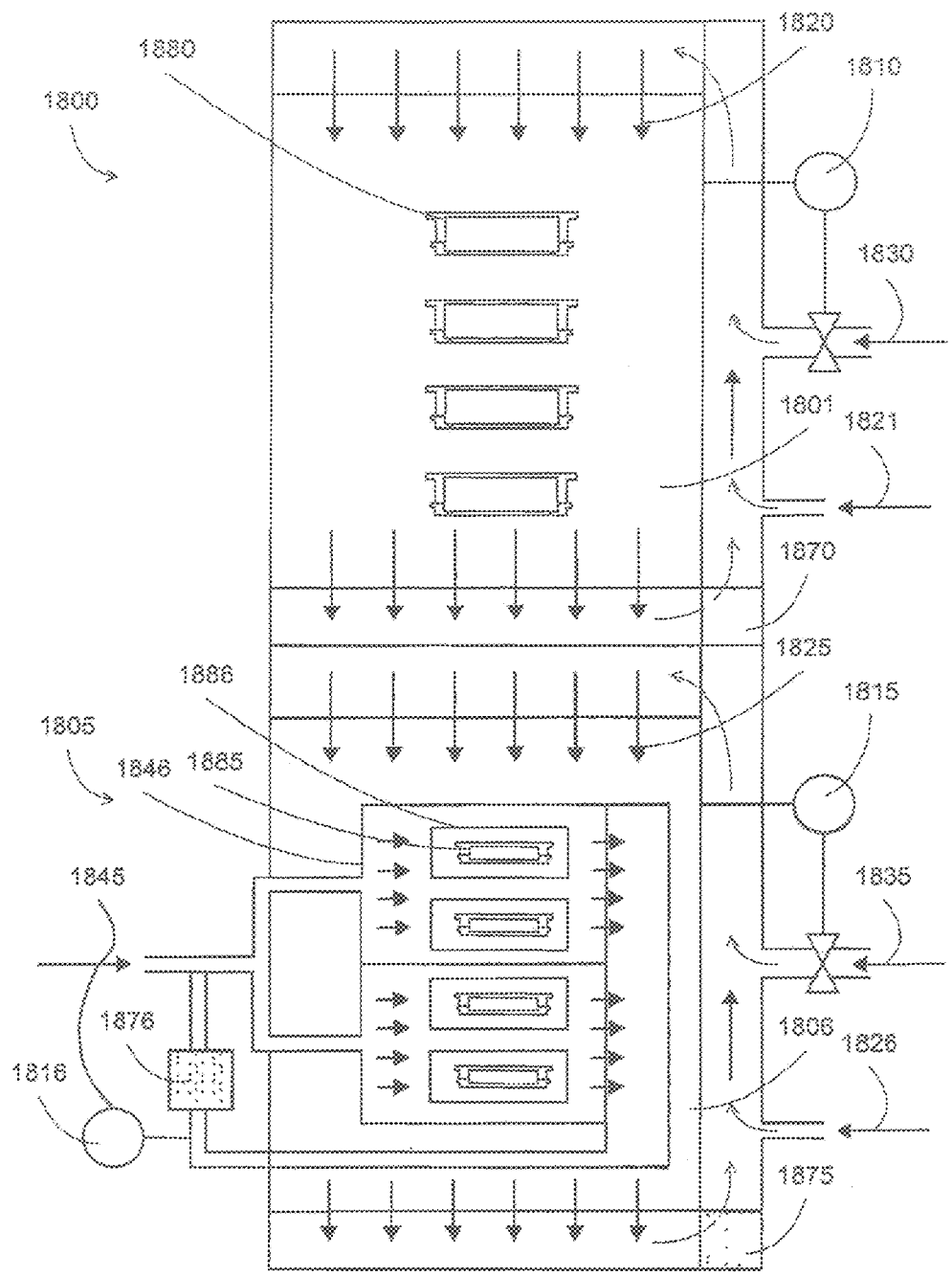
FIG. 18 illustrates a stocker configuration with humidity control according to some aspects of the disclosed embodiment.

FIG. 18 illustrates a stocker configuration with humidity control according to some aspects of the disclosed embodiment. A stocker 1800 can include a storage chamber 1801 for storing outer containers 1880. A laminar purge flow 1820 can be provided in the storage chamber 1801 to provide a clean environment for the outer containers 1880. The purge flow 1820 can be recirculated, with a moisture filter 1870 disposed in the recirculation path to reduce the moisture content in the recirculated purge flow. In some aspects, an optional gas flow 1821 can be added to the recirculation path, for example, to compensate for any gas loss in the recirculation path, and/or to maintain a positive pressure, e.g., a higher than atmospheric pressure, in the storage chamber 1801. A humidity sensor 1810 can be coupled to the storage chamber 1801 to measure the humidity in the storage chamber. Alternatively, the humidity can be coupled to any location on the recirculation path to measure the humidity in the recirculated gas. The humidity sensor 1810 can be used to control a fresh dry gas 1830 to regulate the humidity level in the storage chamber. For example, if the humidity exceeds an upper level, the fresh dry gas 1830 can start until the humidity drops below a lower level of humidity.

The stocker 1800 can further include a storage chamber 1806 for storing protective containers 1846. Multiple semiconductor inner containers 1885 can be stored in the protective containers 1846. The inner containers can be stored in storage compartments 1886. A laminar purge flow 1825 can be provided in the storage chamber 1806 to provide a clean environment for the protective containers 1846. The purge flow 1825 can be recirculated, with a moisture filter 1875 disposed in the recirculation path to reduce the moisture content in the recirculated purge flow. In some aspects of the disclosed embodiment, an optional gas flow 1826 can be added to the recirculation path, for example, to compensate for any gas loss in the recirculation path, and/or to maintain a positive pressure, e.g., a higher than atmospheric pressure, in the storage chamber 1806. A humidity sensor 1815 can be coupled to the storage chamber 1806 to measure the humidity in the storage chamber. Alternatively, the humidity can be coupled to any location on the recirculation path to measure the humidity in the recirculated gas. The humidity sensor 1815 can be used to control a fresh dry gas 1835 to regulate the humidity level in the storage chamber. For example, if the humidity exceeds an upper level, the fresh dry gas 1835 can start until the humidity drops below a lower level of humidity.

A purge gas 1845 can be used to provide a clean environment for the protective containers 1846. The purge gas 1845 can flow pass the inner containers 1885 (and the compartments 1886), and then recirculated back to the protective containers 1846, with a moisture filter 1876 disposed in the recirculation path to reduce the moisture content in the recirculated purge flow. A humidity sensor 1816 can be coupled to a location on the recirculation path to measure the humidity in the recirculated gas. The humidity sensor 1816 can be used to control the flow of the purge gas 1845 to regulate the humidity level in the protective containers. For example, the purge gas 1845 have a normal flow rate. If the humidity exceeds an upper level, the purge gas 1845 can increase above the normal flow rate until the humidity drops below a lower level of humidity. Afterward, the purge gas 1845 can return to the normal flow rate. The process can be repeated, which can control the humidity of the interior of the protective containers to be between the lower and upper levels.

Alternatively, the purge gas 1845 can be merged with the flow 1825 of the storage chamber 1806.

As shown, the inner containers are stored without the substrates. In some aspects of the disclosed embodiment, the inner container can be stored with the substrates stored therein.

As shown, the inner containers are stored in storage compartment 1886. In some aspects of the disclosed embodiment, the inner container can be stored bare, e.g., without being placed in the storage compartments.

Figure 19:
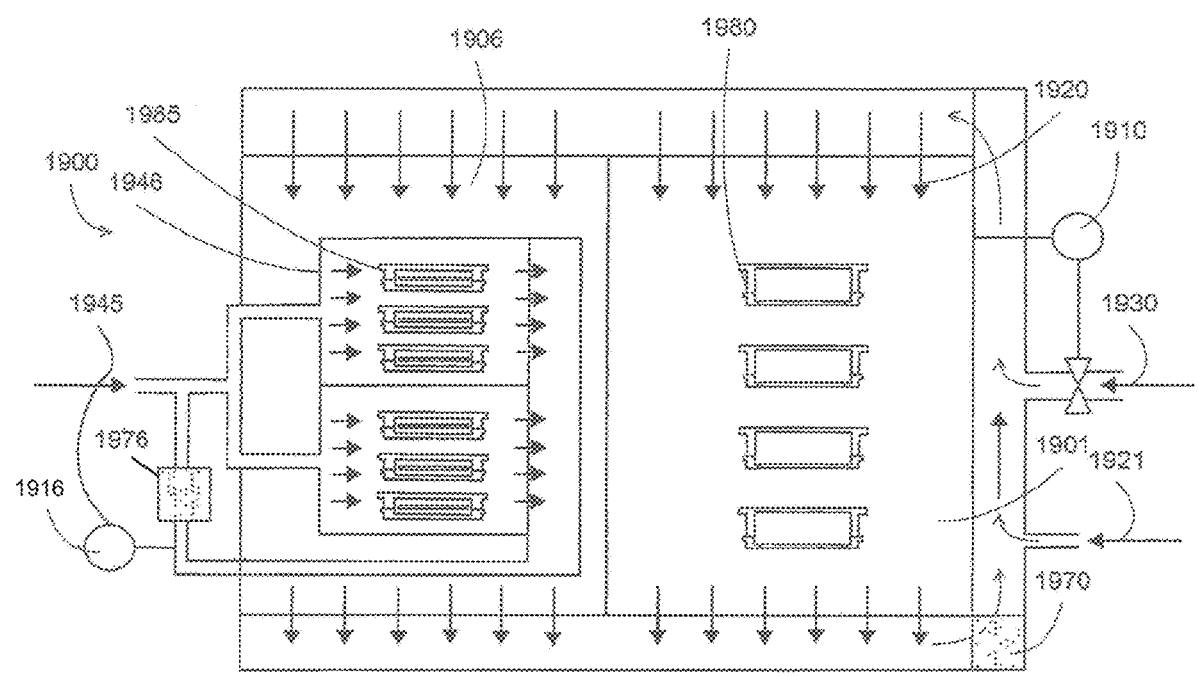
FIG. 19 illustrates a stocker configuration with humidity control according to some aspects of the disclosed embodiment.

FIG. 19 illustrates a stocker configuration with humidity control according to some aspects of the disclosed embodiment. A stocker 1900 can include a storage chamber 1901 for storing outer containers 1980 and a storage chamber 1906 for storing inner containers 1985. A laminar purge flow 1920 can be provided to the storage chambers 1901 and 1905 to provide clean environments for the inner and outer containers 1980. The purge flow 1920 can be recirculated, with a moisture filter 1970 disposed in the recirculation path to reduce the moisture content in the recirculated purge flow. In some aspects, an optional gas flow 1921 can be added to the recirculation path, for example, to compensate for any gas loss in the recirculation path, and/or to maintain a positive pressure, e.g., a higher than atmospheric pressure, in the storage chamber 1901. A humidity sensor 1910 can be coupled to the storage chamber 1901 to measure the humidity in the storage chamber. Alternatively, the humidity can be coupled to any location on the recirculation path to measure the humidity in the recirculated gas. The humidity sensor 1910 can be used to control a fresh dry gas 1930 to regulate the humidity level in the storage chamber. For example, if the humidity exceeds an upper level, the fresh dry gas 1930 can start until the humidity drops below a lower level of humidity.

The storage chamber 1906 can include protective containers 1946 for storing inner containers (with or without substrates). A purge gas 1945 can be used to provide a clean environment for the protective containers 1946. The purge gas 1945 can flow pass the inner containers 1985, and then recirculated back to the protective containers 1946, with a moisture filter 1976 disposed in the recirculation path to reduce the moisture content in the recirculated purge flow. A humidity sensor 1916 can be coupled to a location on the recirculation path to measure the humidity in the recirculated gas. The humidity sensor 1916 can be used to control the flow of the purge gas 1945 to regulate the humidity level in the protective containers. For example, the purge gas 1945 have a normal flow rate. If the humidity exceeds an upper level, the purge gas 1945 can increase above the normal flow rate until the humidity drops below a lower level of humidity. Afterward, the purge gas 1945 can return to the normal flow rate. The process can be repeated, which can control the humidity of the interior of the protective containers to be between the lower and upper levels.

Alternatively, the purge gas 1945 can be merged with the flow 1920 of the storage chamber 1906.

As shown, the inner containers are stored with the substrates. In some aspects of the disclosed embodiment, the inner container can be stored without the substrates stored therein.

As shown, the inner containers are stored bare, e.g., without being placed in the storage compartments. In some aspects of the disclosed embodiment, the inner container can be stored in storage compartments.

Figure 20A:
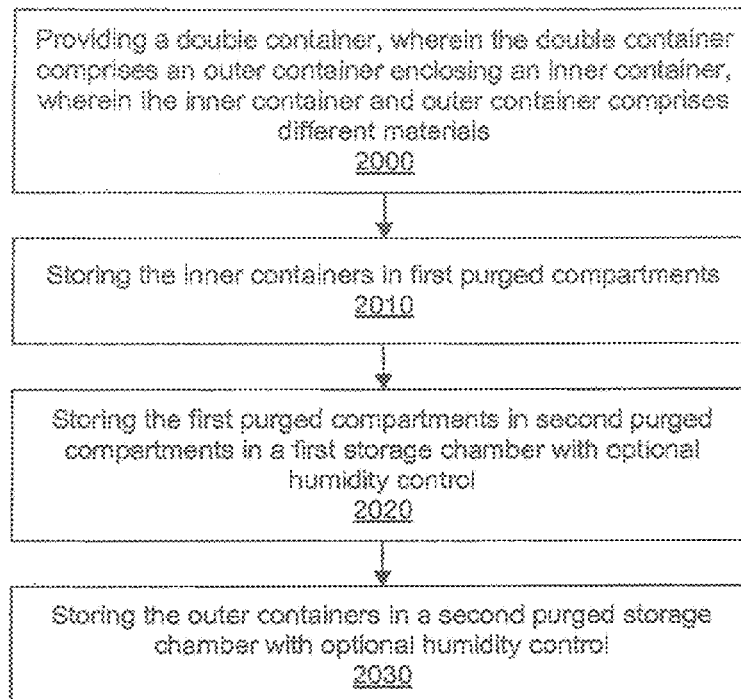
FIGS. 20A-20B illustrate flow charts for conditioning a stocker according to some aspects of the disclosed embodiment.
Figure 20B:
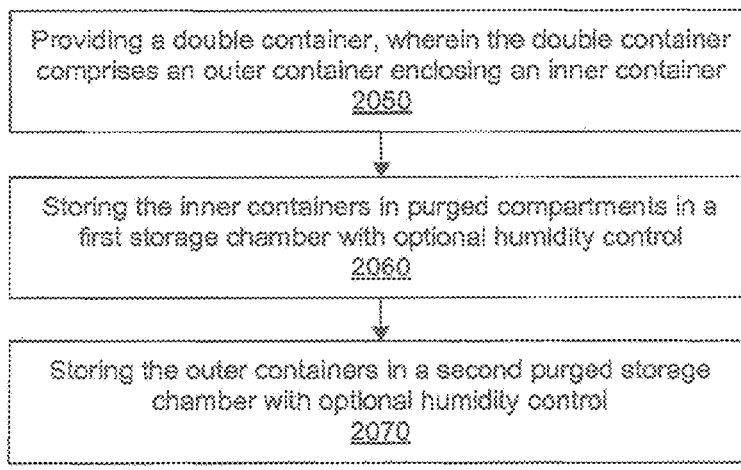

FIGS. 20A-20B illustrate flow charts for conditioning a stocker according to some aspects of the disclosed embodiment. In FIG. 20A, operation 2000 provides a double container, wherein the double container comprises an outer container enclosing an inner container, wherein the inner container and outer container comprises different materials. Operation 2010 stores the inner containers in first purged compartments. Operation 2020 stores the first purged compartments in second purged compartments in a first storage chamber with optional humidity control. Operation 2030 stores the outer containers in a second purged storage chamber with optional humidity control.

In FIG. 20B, operation 2050 provides a double container, wherein the double container comprises an outer container enclosing an inner container. Operation 2030 stores the inner containers in purged compartments in a first storage chamber with optional humidity control. Operation 2060 stores the outer containers in a second purged storage chamber with optional humidity control.

In some aspects, the present embodiment discloses purge compartments for handling inner containers, such as euv inner pod for reticle storage. The purge compartment can include inlets for accepting a purge gas, which allows the stored inner container to be in a clean environment. Further, the purge compartment can isolate the inner container, thus can prevent cross contamination, for example, from the outer container. The purge compartments can store the inner containers, e.g., the euv inner pods, and can be used as a transport carrier for the inner containers. The purge compartments can be made of materials having low outgassing property, such as metals or alloys. Since the inner pods of euv double containers are typically made of metal, a metal purge compartment can provide a cleaner environment, as compared to a polymer based outer pods of the euv double containers.

Figures 21A, 21B, 21C:
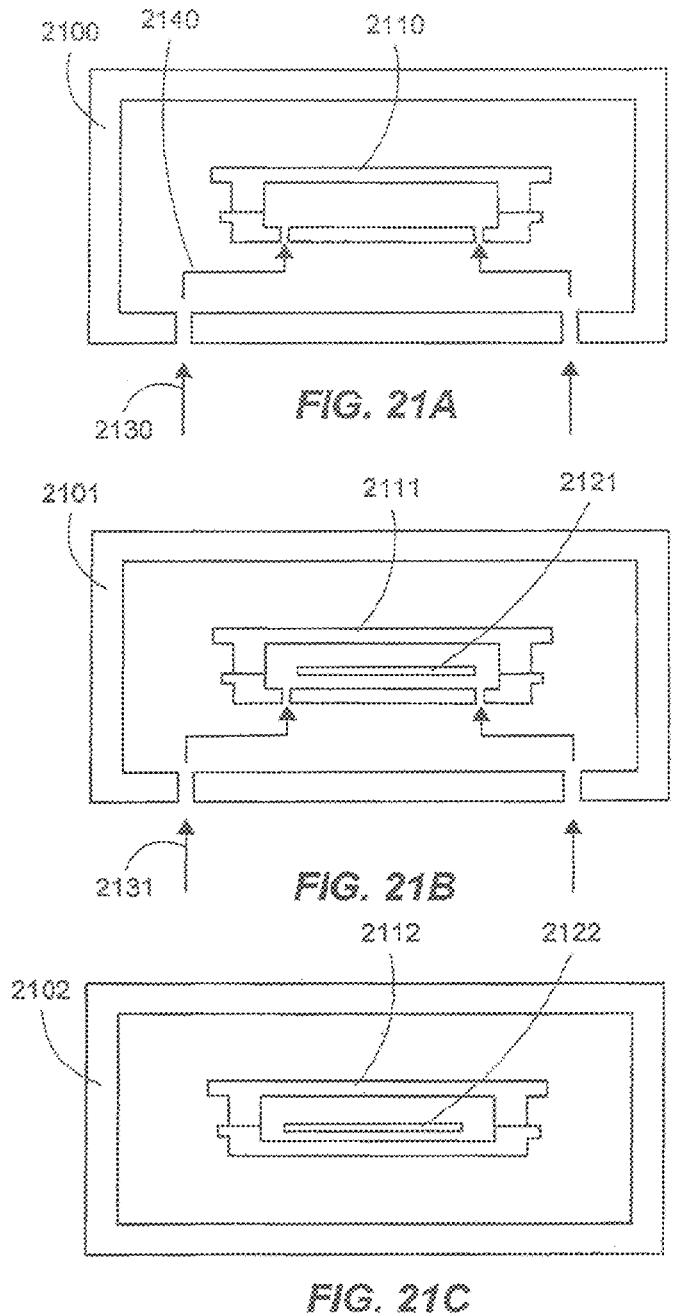
FIGS. 21A-21C illustrate configurations for purge compartments according to some aspects of the disclosed embodiment.

FIGS. 21A-21C illustrate configurations for purge compartments according to some aspects of the disclosed embodiment. In FIG. 21 A, a purge compartment 2100 can be used to hold an empty inner container 2110, e.g., an inner pod of an euv double container without the reticle stored therein. The purge compartment can have inlets 2130 for accepting a purge gas, such as nitrogen or air. For storage, the purge compartment can be continuously purged. The purge operation can be with fresh dry gas, or can be with recirculated gas. The recirculated gas can have a humidity feedback, for example, to regulate the humidity level to be below a set point (such as below 10 or 5%) or to be between a range of humidity (such as between 5 and 10%). The humidity feedback can include a humidity sensor, controlling a fresh dry gas source, so that a fresh dry gas flow can be supplied when the humidity level exceeds the set point.

For transportation, the purge compartment can be removed from the purged location, and then transferred to a new location, such as a location with a purged gas for re-purging the inside of the compartment. The purged environment inside the purge compartment can prevent contamination of the inner container 2110 for a time period, for example, for the transport time.

The inner container can be stored close or stored open in the purge compartment. For stored close configuration, the inside of the inner container can also be purged. For example, the inner container can have inlets for accepting a purge gas. The purged environment of the purge compartment can be at a pressure higher than atmospheric, thus the purge gas can enter the interior of the inner compartment, for example, through the inlets of the inner container. The inlets of the inner container can be positioned so that a portion of the purged gas entering the inlets of the purge compartment can enter the inner container. The purge compartment can have a conduit assembly 2140 to guide a portion of the purge gas to the inlets of the inner container.

In FIG. 21B, a purge compartment 2101 can be used to hold an inner container 2111, such as an inner pod of an euv double container with the reticle 2121 stored therein. The purge compartment can have inlets 2131 for accepting a purge gas, such as nitrogen or air. Operations, configurations and usages for the purge compartment 2101 can be similar to the purge compartment 2100.

In FIG. 21C, a purge compartment 2102 can be used to hold an inner container 2112, such as an inner pod of an euv double container with the reticle 2122 stored therein. The purge compartment can be close to the outside ambient, e.g., the purge compartment can be filled with a purge gas, and then sealed off, for example, for transportation.

In an aspect of the disclosed embodiment, the purge compartments can be stored in a storage chamber of a stocker having a purge gas system for keeping clean the inside volume of the stored objects, such as the inner pods of an euv double container. The purge gas system can deliver nitrogen (or other inactive gases) to the inside of an object, effectively replacing the inside ambient, restoring the cleanliness level, and can eliminate or reduce particulate outgassing. For example, the volume between the purge compartment and the inner container of a double container euv reticle carrier is continuously (or intermittently) purged with nitrogen during storage. Further, by replacing the polymer based outer containers of the euv double containers with the purge compartments (which can be made of metals to reduce outgassing), the environment of the inner containers can be cleaner.

In an aspect of the disclosed embodiment, the storage chamber can be purged with a laminar flow for keeping the storage clean, preventing or reducing any contaminants from adhering to the outside of the carrier. For example, clean gas, such as compressed air after filtered, can be introduced to the storage chamber, either from a top portion, or from side portions to reduce or eliminate cross contamination.

In an aspect of the disclosed embodiment, the purge gas can be recirculated, removing any chance of contamination from outside ambient. The recirculation gas can comprise inert gas such as nitrogen, or in active gas such as air. The recirculation gas can be filtered to remove particulates, and can be cooled to reduce thermal motions. Thus the inside ambient of the storage chamber is isolated from the outside ambient, permitting a level of cleanliness suitable for the stored objects. Humidity feedback, as disclosed above, can be used to reduce humidity levels in the storage chamber.

Figure 22:
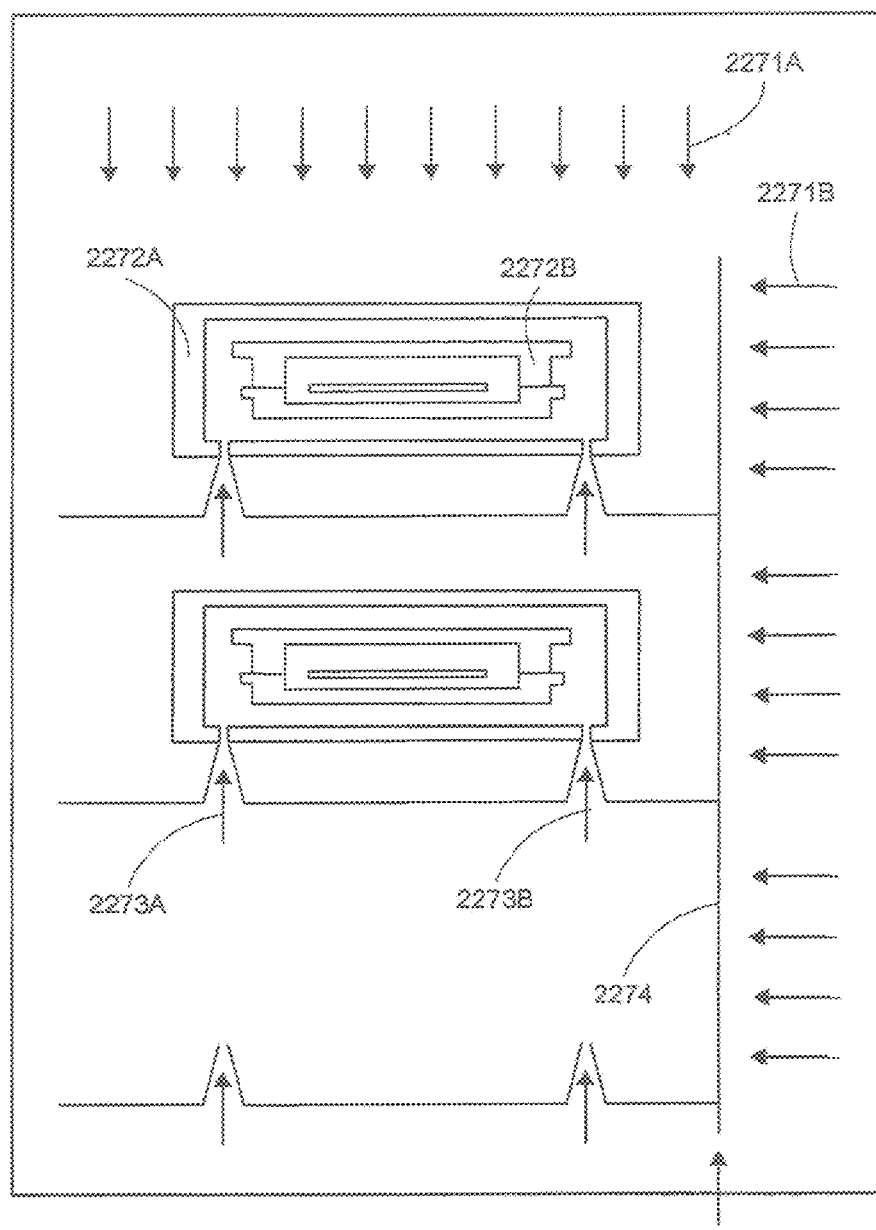
FIG. 22 illustrates a storage chamber including a number of purge compartments according to some aspects of the disclosed embodiment.

FIG. 22 illustrates a storage chamber including a number of purge compartments according to some aspects of the disclosed embodiment. The storage chamber can be similar to the storage chamber described in FIG. 7 of U.S. Pat. No. 9,536,763 issued on Jan. 3, 2018 hereby incorporated by reference in its entirety.

A central gas line 2274 delivers purge gas to the purge compartments. In some aspects, the purge gas delivers 2273A/2273B purge gas continuously, without any active metering or controlling valves. The purge gas flow can be predetermined during fabrication, and can have optional metering valves for manual adjustment, same for all compartments or different for different compartments, but there can be no active or feedback controlling means. The purge gas can flow a fixed amount of gas, regardless of whether or not an object is located at that compartment. In another aspect of the disclosed embodiment, the purge gas can be actively controlled, for example, to reduce the loss of purge gas for compartment without any stored object. Humidity feedback, as disclosed above, can be used to reduce humidity levels in the purged gas path.

The purge gas can deliver clean gas, such as nitrogen, to the inside volume of the stored object, such as the volume between a purge compartment 2272A and an inner container 2272B of a double container reticle carrier. Laminar flow (from outside ambient or from a recirculated ambient) can be delivered to the storage compartments, either for all compartments from top 2271A (or from bottom, not shown), or from sides 2271B for individual compartments.

The inner container can be stored close or stored open in the purge compartment. For stored close configuration, the inside of the inner container can also be purged. For example, the inner container can have inlets for accepting a purge gas. The purged environment of the purge compartment can be at a pressure higher than atmospheric, thus the purge gas can enter the interior of the inner compartment, for example, through the inlets of the inner container. The inlets of the inner container can be positioned so that a portion of the purged gas entering the inlets of the purge compartment can enter the inner container. The purge compartment can have a conduit assembly to guide a portion of the purge gas to the inlets of the inner container.

The inner containers can be stored with or without the substrates, e.g., the euv reticles. The inner containers, together with the reticles inside, can be periodically decontaminated, for example, in a high vacuum chamber. The decontamination high vacuum chamber can be located in the stocker, for example, to avoid exposing the inner containers and the reticles to non-clean ambient.

The purge compartments can be decontaminated with the inner containers and the reticles. For example, the purge compartments, with the inner containers and the reticles, can be transferred to the decontamination chamber for decontamination. Alternatively, the purge compartments can be open, and the inner containers and the reticles are transferred to the decontamination chamber for decontamination. After decontaminated, the inner containers and the reticles are placed back in the purge compartments for storage.

FIGS. 23A-23B illustrate flow charts for purge compartment storage according to some aspects of the disclosed embodiment. In FIG. 23A, operation 2300 stores an inner container of a double container in a purged compartment, wherein the double container comprises an outer container enclosing an inner container, wherein the inner container and outer container comprises different materials. Operation 2310 disconnects the purge gas. Operation 2320 transports the inner container.

In FIG. 23B, operation 2340 stores an inner container of a double container in a compartment, wherein the double container comprises an outer container enclosing an inner container, wherein the inner container and outer container comprises different materials. Operation 2350 purges the compartment. Operation 2360 stores the inner container.

In some aspects, the present embodiment discloses a stocker having a decontamination chamber for periodically decontaminating the substrates, such as the euv reticles. The reticles can be stored in inner containers, with the inner containers stored in purge compartments, and the purge compartments stored in a first storage chamber. The outer containers can be stored separately in a second storage chamber. A decontamination chamber, such as a high vacuum chamber, can be included to periodically decontaminating the reticles, optionally with the inner containers and optionally the purge compartments.

Figure 24A:
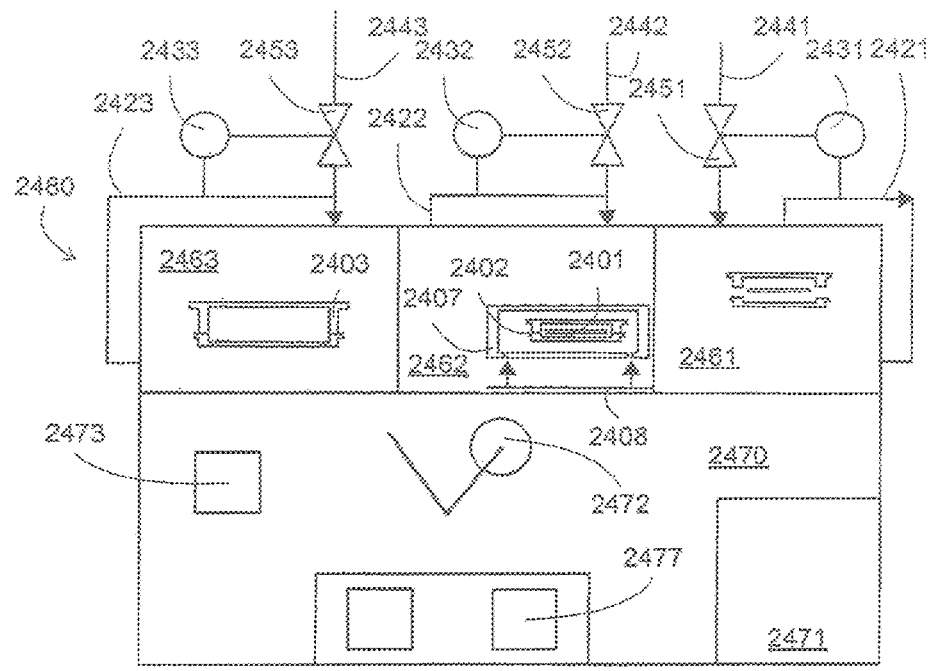
FIGS. 24A-24B illustrate a stocker according to some aspects of the disclosed embodiment.
Figure 24B:
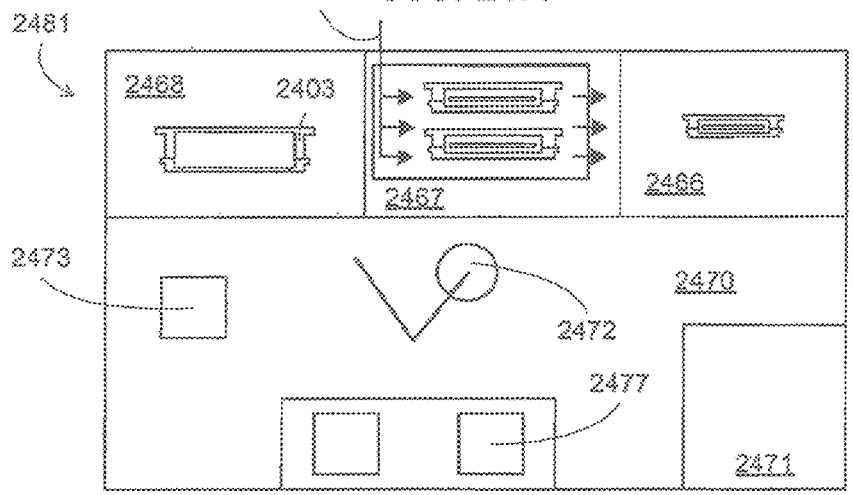

FIGS. 24A-24B illustrate a stocker according to some aspects of the disclosed embodiment. In FIG. 23A, a stocker 2480 can include a storage chamber 2463 for outer container storage, storage chamber 2462 for inner container storage which can be stored in purge compartments, high vacuum chamber 2461 for decontamination, and portion 2470 for substrate and container handling. Loading stations 2477 are configured for manual or automatic loading and unloading containers. Transfer station 2473 is optionally included for either container or workpiece support. Robot 2472 can handle workpieces and workpiece containers between loading station 2477 and storage chambers 2475 and 2476. Controller 2471 contains programs, sensors and commands to operate the stocker.

The storage chambers can be purged with humidity control. For example, storage chamber 2463/2462 can have a recirculation loop 2423/2422. A fresh dry gas source 2443/2442 can be coupled to the storage chamber and to the recirculation loop. A humidity sensor 2433/2432 can be coupled to the recirculation loop, and can be used to control a valve 2453/2452 for regulating the gas source 2433/2432. For example, if the humidity level in the storage chamber 2463/2462, measured in the recirculation loop, exceeds a higher limit, the valve 2453/2452 can be open to allow fresh dry gas to enter the storage chamber, thus reducing the humidity in the chamber. After the humidity reduces, for example, below a lower limit, the valve 2453/2452 can be close. Thus the humidity in the storage chamber 2463/2462 can be controlled to be in a range between the lower limit and the higher limit.

The outer containers 2403 can be stored in the storage chamber 2463. The inner containers 2402, together with reticles 2401, can be stored in purge compartments 2404. The purge compartments 2407, with the inner containers and reticles, can be stored in storage chamber 2462. Purged gas 2408 can be provided to the interior of the purge compartments 2407, similar to the configurations described above.

The decontamination chamber 2461 can be used to decontaminate the reticles periodically, e.g., after a time period of storage. The decontamination process can include the inner containers and the reticles with the inner containers open, e.g., the top lid separated from the bottom support, to expose the reticles. Alternatively, the decontamination process can include the inner containers and the reticles with the inner containers close, e.g., the reticles are sealed inside the inner containers. Purge gas can be provided to the interior of the inner containers for decontamination.

Alternatively, the decontamination process can include the purge compartment and the inner containers, with or without the reticles.

In FIG. 23B, a stocker 2481 can include a storage chamber 2468 for outer container storage, storage chamber 2467 for inner container storage which can be stored in protective compartments, high vacuum chamber 2466 for decontamination, and a portion for substrate and container handling.

The storage chambers can be purged with humidity control. The inner containers, together with reticles, can be stored in protective compartments, which can be stored in storage chamber 2467. Purged gas 2409 can be provided to the interior of the protective compartments, similar to the configurations described above.

The decontamination chamber 2461 can be used to decontaminate the reticles periodically, e.g., after a time period of storage. The decontamination process can include the inner containers and the reticles with the inner containers close, e.g., the reticles are sealed inside the inner containers. Purge gas can be provided to the interior of the inner containers for decontamination.

Figure 25:
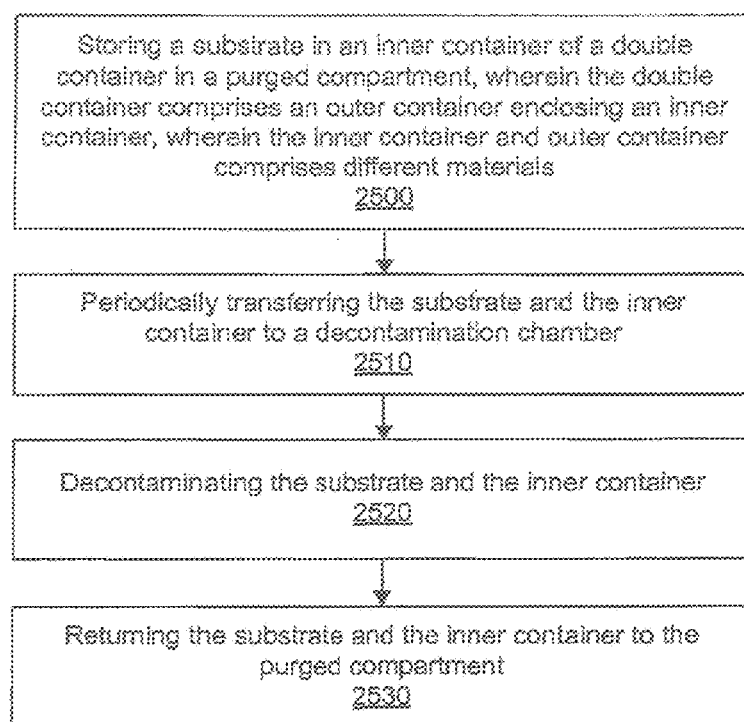
FIG. 25 illustrates a flow chart for storing reticles according to some aspects of the disclosed embodiment.

FIG. 25 illustrates a flow chart for storing reticles according to some aspects of the disclosed embodiment. Operation 2500 stores a substrate in an inner container of a double container in a purged compartment, wherein the double container comprises an outer container enclosing an inner container, wherein the inner container and outer container comprises different materials. Operation 2510 periodically transfers the substrate and the inner container to a decontamination chamber. Operation 2520 decontaminates the substrate and the inner container. Operation 2530 returns the substrate and the inner container to the purged compartment.

The invention claimed is:

1. Method for forming a clean environment, for semiconductor substrates, with low humidity level, being ten percent (10%) humidity or below, the method comprising the steps of:
   measuring a first humidity level in a first environment with a first humidity sensor to accomplish effecting maintaining of the first environment within a first predetermined humidity interval;
   purging, with at least one first nozzle, the first environment with a first purge gas that flows from the at least one first nozzle to accomplish effecting reducing of the first humidity level to a value within the first predetermined humidity interval; and
   purging, with at least one second nozzle, separate and distinct from the at least one first nozzle, a second environment, which is disposed within the first environment, with a second purge gas that flows from the second nozzle separate from the first purge gas, to accomplish effecting reducing of a second humidity level in the second environment to within a second predetermined humidity interval.

2. The method according to claim 1, wherein an environmental gas in the first environment is recirculated, so as to form a recirculated gas stream.

3. The method according to claim 1, wherein fresh dry gas is added when the first humidity level exceeds a predetermined threshold of the first predetermined humidity interval.

4. The method according to claim 1, wherein the first humidity level or the second humidity level is measured
   from the gas in a respective one of the first environment or the second environment, or
   from the first purge gas or the second purge gas in an exhaust of the provided first purge gas or second purge gas, or
   from a rate of pressure reduction of a respective one of the first environment or the second environment.

5. The method according to claim 1, wherein the second environment is formed within a container for storing semiconductor substrates for transport or wherein the second environment is formed within a chamber for storing semiconductor substrates for transport or for storing containers.

6. The method according to claim 1, wherein the first environment is formed within a stocker for storing containers and wherein the second environment is formed within a container for storing semiconductor substrates.

7. The method according to claim 2, wherein the first humidity level in the recirculated gas stream is reduced by means of a first humidity reducing assembly coupled to the recirculated gas stream.

8. The method according to claim 5, wherein the first environment is formed within a chamber for processing a container, comprising the steps of:

providing a container inside an interior of the chamber,
cleaning the container to remove surface contaminants,
removing moisture from the interior of the chamber until the first humidity level reaches a value within the first predetermined humidity interval by evacuating the chamber and supplying the first purge gas to the chamber.

9. The method according to claim 5, wherein the second environment is formed within a container for storing semiconductor substrates, comprising the steps of:
cleaning the container and/or drying the container,
purging an interior of the container with a gas flow until the second humidity level reaches a value within the second predetermined humidity interval.

10. The method according to claim 8, wherein a low humidity condition, being ten percent (10%) humidity or below, in the chamber is maintained for a predetermined period of time.

\* \* \* \* \*